US009647037B2

(12) United States Patent

Lu et al.

(10) Patent No.: US 9,647,037 B2

(45) Date of Patent: May 9, 2017

(54) RESISTIVE RANDOM ACCESS MEMORY DEVICE WITH RESISTANCE-BASED STORAGE ELEMENT AND METHOD OF FABRICATING SAME

(71) Applicant: QUALCOMM Incorporated, San Diego, CA (US)

(72) Inventors: Yu Lu, San Diego, CA (US); Xia Li, San Diego, CA (US); Seung Hyuk Kang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/835,314

(22) Filed: Aug. 25, 2015

(65) Prior Publication Data

US 2017/0062526 A1 Mar. 2, 2017

(51) Int. Cl.

*H01L 27/24* (2006.01)
*H01L 45/00* (2006.01)

(52) U.S. Cl.

CPC ...... *H01L 27/2463* (2013.01); *H01L 27/2436* (2013.01); *H01L 45/08* (2013.01); *H01L 45/1226* (2013.01); *H01L 45/1246* (2013.01); *H01L 45/1253* (2013.01); *H01L 45/1608* (2013.01); *H01L 45/1683* (2013.01)

(58) Field of Classification Search

CPC . H01L 27/108; H01L 27/2463; H01L 45/085; H01L 45/141; H01L 45/143; H01L 45/1206; H01L 45/1266; H01L 45/1683; H01L 27/24; H01L 27/2436; H01L 45/08; H01L 45/1226; H01L 45/1246; H01L 45/1253; H01L 45/1608

See application file for complete search history.

(56) References Cited

U.S. PATENT DOCUMENTS 6,490,194 B2 12/2002 Hoenigschmid
6,791,871 B2 9/2004 Freitag et al.
7,298,640 B2 11/2007 Chen et al.
7,423,281 B2 9/2008 Rohr et al.
7,876,597 B2 1/2011 Liu
2006/0266990 A1 11/2006 Wicker
2007/0069273 A1* 3/2007 Rohr .................. H01L 27/2463 257/311
2007/0121369 A1 5/2007 Happ
2009/0027955 A1* 1/2009 Koh .................... G11C 11/1675 365/163
2009/0072215 A1* 3/2009 Lung .................. H01L 27/2436 257/4
2010/0032636 A1 2/2010 Jin et al.
(Continued)

FOREIGN PATENT DOCUMENTS

DE 102007045457 A1 3/2009

OTHER PUBLICATIONS

International Search Report and Written Opinion—PCT/US2016/044258—ISA/EPO—Oct. 28, 2016.

*Primary Examiner* — Fazli Erdem

(74) *Attorney, Agent, or Firm* — Toler Law Group

(57) ABSTRACT

A method of fabrication of a device includes forming a first electrode and a second electrode. The method further includes forming a resistive material between the first electrode and the second electrode to form a resistance-based storage element of a resistive random access memory (RRAM) device.

21 Claims, 24 Drawing Sheets

(56) References Cited

U.S. PATENT DOCUMENTS

2011/0017971 A1* 1/2011 Kim .................. H01L 27/10876
257/5
2013/0034945 A1 2/2013 Park

* cited by examiner

100
Ground select line 110
116
Bit Line Select Line 112
118
Bit Line 114
102
104
105
R
108
109
106
150
172
170
154
156
158
160
162
164
166
104
152
108
118

RESISTIVE RANDOM ACCESS MEMORY DEVICE WITH RESISTANCE-BASED STORAGE ELEMENT AND METHOD OF FABRICATING SAME

I. FIELD

This disclosure is generally related to electronic devices, such as memory devices.

II. DESCRIPTION OF RELATED ART

Resistive random access memory (RRAM) devices use resistance-based storage elements to store information. For example, a resistance-based storage element may be programmed to a high resistance state to indicate a particular value (e.g., a logic "1" value) or to a low resistance state to indicate another value (e.g., a logic "0" value). The state of the resistance-based storage element may be sensed by applying a voltage to the resistance-based storage element and by sensing a current through the resistance-based storage element that results from the voltage. The current may indicate (by Ohm's law) the state of the resistance-based storage element.

RRAM devices may in some cases be associated with high costs of fabrication. For example, an RRAM device may include multiple interconnects to access the resistance-based storage elements, such as a crossbar array of metal wires. The metal wires may intersect near each resistance-based storage element to enable access to each resistance-based storage element. The crossbar array may utilize a large circuit area of an integrated circuit and may be complicated to operate in some cases. Further, the crossbar array may be fabricated using a mask, which increases fabrication cost.

III. SUMMARY

A resistance-based random access memory (RRAM) device may have a string-based (or "NAND") configuration in which resistance-based storage elements of the RRAM device are coupled in series. Each of the resistance-based storage elements may be accessed using a corresponding access transistor. For example, each resistance-based storage element may be coupled in parallel to a corresponding access transistor. The parallel configuration may reduce a number of interconnects (e.g., metal wires, such as a crossbar array) to access the resistance-based storage elements, thus reducing device cost and circuit area.

In addition, the resistance-based storage elements of the RRAM device may have an in-plane configuration that enables a simplified fabrication process to reduce fabrication cost of the RRAM device. For example, a resistance-based storage element may include electrodes and a resistive material that are formed "side-by-side" (e.g., horizontally relative to a surface of a substrate instead of being stacked vertically relative to the surface of the substrate). The electrodes may be formed prior to formation of the resistive material. Because the in-plane configuration may enable the electrodes to protect (or "sandwich") the resistive material, self-aligned contacts (SACs) may be formed to connect the resistance-based storage element to a corresponding access transistor. For example, the electrodes may function as a mask (or as a spacer) during an etch process used to define contact holes in which the SACs are to be formed. By using the electrodes as a mask, misalignment (or "overshoot") of the etch process may not cause a short between device components (e.g., the electrodes may protect the resistive material from being etched in case of misalignment of the etch process). In this case, fabrication cost may be reduced by avoiding use of a separate mask for the etch process.

The in-plane configuration may also facilitate increased storage density of a memory device. For example, because the resistive material may be protected (or "sandwiched") between the electrodes, a SAC may adjoin the resistance-based storage element without creating a short circuit to the resistive material. The in-plane configuration may therefore enable an RRAM device to have a higher storage density as compared to other devices. For example, the in-plane configuration may enable an RRAM device to have a higher storage density as compared to devices that include "vertically" deposited storage element layers, such as in the case of certain magnetoresistive memory devices.

In a particular example, a method of fabrication of a device includes forming a first electrode and a second electrode. The method further includes forming a resistive material between the first electrode and the second electrode to form a resistance-based storage element of a resistive random access memory (RRAM) device.

In another example, a computer-readable medium stores instructions that are executable by a processor to perform operations during fabrication of a device. The operations include initiating formation of a first electrode and a second electrode. The operations further include initiating formation of a resistive material between the first electrode and the second electrode to form a resistance-based storage element.

In another example, an apparatus includes a first electrode of a resistance-based storage element, a second electrode of a resistance-based storage element, and a resistive material of the resistance-based storage element. A first interface of the resistive material and the first electrode and a second interface of the resistive material and the second electrode are substantially perpendicular to a surface of a substrate.

In another example, an apparatus includes means for generating a resistive state indicating a value associated with a resistance-based storage element. The apparatus further includes means for providing a current to the means for generating and means for receiving the current from the means for generating. A first interface of the means for generating and the means for receiving and a second interface of the means for generating and the means for providing are substantially perpendicular to a surface of a substrate.

One particular advantage provided by at least one of the disclosed examples is reduced cost and complexity of a fabrication process. For example, electrodes of a resistance-based storage element may function as a mask in case of an "overshoot" of an etch process. Accordingly, cost associated with use of a separate mask for an etch process may be reduced or avoided. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Certain examples are described below with reference to the drawings. In the description and the drawings, similar or common features may be indicated by common reference numbers.

Figure 1:
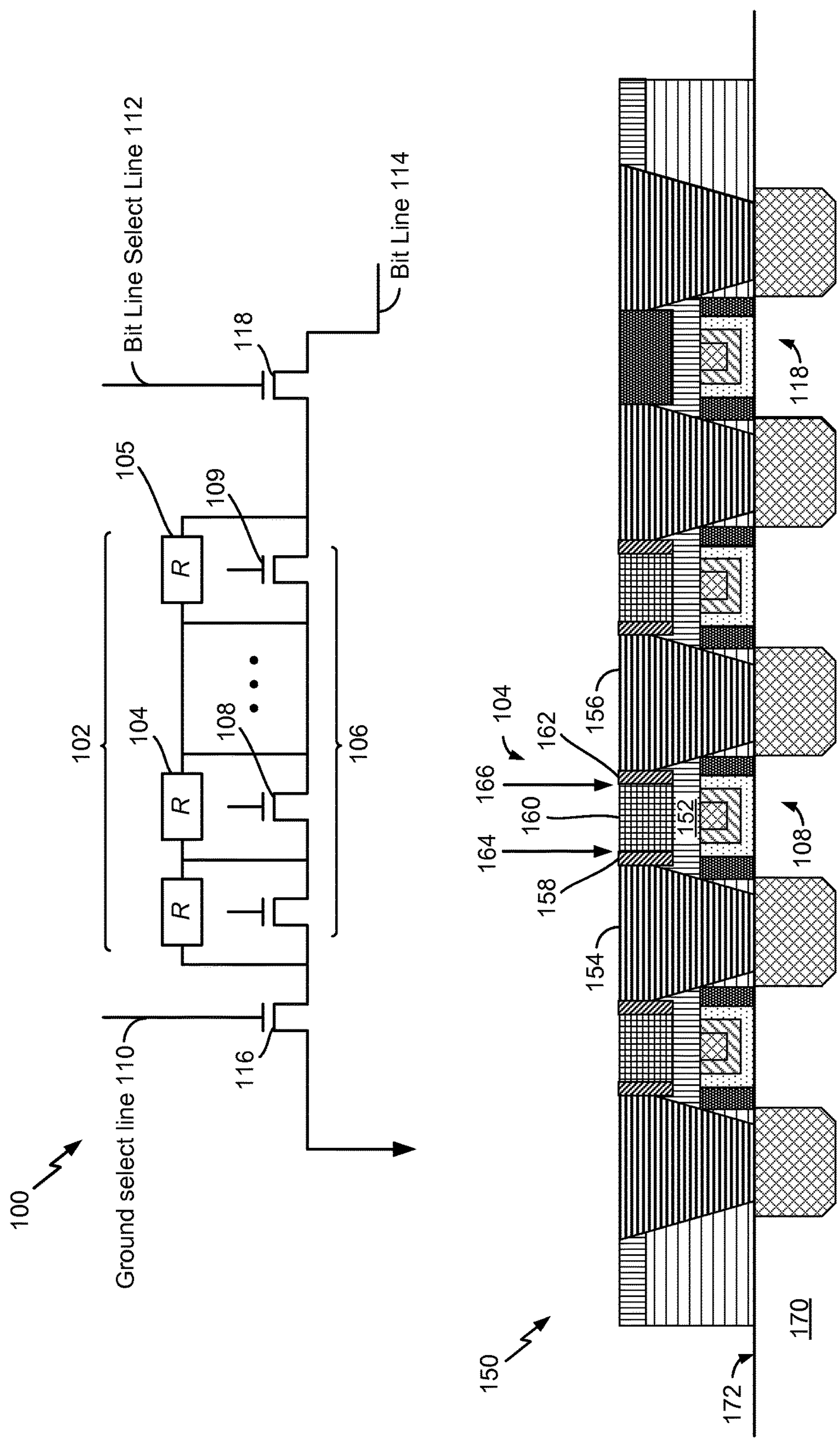
FIG. 1 depicts a schematic view and a cross-sectional view of an illustrative example of a device that includes a SAC to couple a resistance-based storage element in parallel to an access transistor.

FIG. 1 illustrates a schematic view of an illustrative example of a resistive random access memory (RRAM) device 100. FIG. 1 further illustrates a cross-sectional view 150 of an illustrative implementation of a portion of the RRAM device 100.

The RRAM device 100 may include a plurality of resistance-based storage elements 102. For example, the plurality of resistance-based storage elements 102 may include a representative resistance-based storage element 104. As another example, the plurality of resistance-based storage elements 102 may include a second resistance-based storage element 105. The plurality of resistance-based storage elements 102 may be coupled to each other in series (e.g., in a row). For example, the resistance-based storage element 104 is coupled in series to the second resistance-based storage element 105.

The RRAM device 100 may further include a plurality of access transistors 106, such as a plurality of metal-oxide-semiconductor field-effect transistors (MOSFETs). For example, the plurality of access transistors 106 may include a representative access transistor 108. As another example, the plurality of access transistors 106 may include a second access transistor 109. The plurality of access transistors 106 may be coupled to each other in series (e.g., in a row). For example, the access transistor 108 is coupled in series to the second access transistor 109.

One or more of the plurality of resistance-based storage elements 102 may be coupled in parallel to a corresponding one of the plurality of access transistors 106. For example, the resistance-based storage element 104 is coupled in parallel to the access transistor 108. As another example, the second resistance-based storage element 105 is coupled in parallel to the second access transistor 109.

The RRAM device 100 may further include a ground select line 110, a bit line select line 112, a bit line 114, a first select transistor 116 coupled to the plurality of access transistors 106, and a second select transistor 118 coupled to the plurality of access transistors 106. The ground select line 110 may be coupled to the first select transistor 116. For example, the ground select line 110 may be coupled to a first gate terminal of the first select transistor 116, and a source-or-drain (S/D) terminal of the first select transistor 116 may be coupled to a ground node. The bit line select line 112 and the bit line 114 may be coupled to the second select transistor 118. For example, the bit line select line 112 may be coupled to a second gate terminal of the second select transistor 118, and the bit line 114 may be coupled to an S/D terminal of the second select transistor 118.

The RRAM device 100 may have a string (or "NAND") configuration. For example, the plurality of resistance-based storage elements 102 may have a series configuration that forms a "NAND" string of resistance-based storage elements. Depending on the particular application, the RRAM device 100 may be implemented within a planar device or within a three-dimensional (3D) device, such as a 3D fin-field-effect transistor (FinFET) device.

During operation, resistive states may be programmed to the plurality of resistance-based storage elements 102 to indicate logic values. For example, a high resistance state may indicate a first logic value (e.g., a logic one value), and a low resistance state may indicate a second logic value (e.g., a logic zero value). Furthermore, more resistance states may be programmed such that each of the resistance-based storage elements 102 may store more than one bit of information.

To further illustrate, to initiate programming of a particular resistive state to the resistance-based storage element 104, a first bias voltage or a ground potential (e.g., VSS) may be applied to a gate terminal of the access transistor 108, and a second bias voltage (e.g., VDD) may be applied to gate terminals of other access transistors of the plurality of access transistors 106, to the ground select line 110, and to the bit line select line 112. The bit line 114 may be biased using a write voltage to generate a write current from the bit line 114, through the resistance-based storage element 104 (and through each of the access transistors 106 other than the access transistor 108), to the ground select line 110. The write current may set (e.g., change) a resistive state of the resistance-based storage element 104, such as by creating a high-resistance state or a low-resistance state or a resistance state in between.

To sense the resistive state of the resistance-based storage element 104, a first bias voltage or a ground potential (e.g., VSS) may be applied to a gate terminal of the access transistor 108, and a second bias voltage (e.g., VDD) may be applied to gate terminals of other access transistors of the plurality of access transistors 106, to the ground select line 110, and to the bit line select line 112. The bit line 114 may be biased using a read voltage to generate a read current from the bit line 114, through the resistance-based storage element 104 (and through each of the access transistors 106 other than the access transistor 108), to the ground select line 110. A magnitude of the read current may indicate a resistive state of the resistance-based storage element 104 (e.g., whether the resistance-based storage element 104 has a high-resistive state or a low-resistance state).

Although programming and sensing of a single resistive state has been described for convenience of description, multiple resistive states may be programmed and sensed in parallel. For example, gate terminals of multiple access transistors of the plurality of access transistors 106 may be biased using the first bias voltage or ground potential (e.g., VSS) during a programming operation to generate a write current through multiple corresponding resistance-based storage elements of the plurality of resistance-based storage elements 102. As another example, gate terminals of multiple access transistors of the plurality of access transistors 106 may be biased using the first bias voltage or ground potential (e.g., VSS) during a sensing operation to generate a read current through multiple corresponding resistance-based storage elements of the plurality of resistance-based storage elements 102.

The cross-sectional view 150 illustrates certain features in accordance with the disclosure. The cross-sectional view 150 illustrates that the resistance-based storage element 104 may be formed above the access transistor 108. For example, the resistance-based storage element 104 may be formed during a middle-of-line (MoL) processing stage on a dielectric region 152 (e.g., oxide) that is disposed on the access transistor 108. The resistance-based storage element 104 may include a first electrode 158, a resistive material 160, and a second electrode 162.

The electrodes 158, 162 and the resistive material 160 have an in-plane (or "horizontal") configuration (e.g., where read and write currents are generated "horizontally" to, or substantially parallel to, a surface 172 of a substrate 170 (e.g., a silicon substrate). For example, each of the electrodes 158, 162 and the resistive material 160 have a common distance relative to the substrate 170 (instead of being formed "on top" of one another such that each layer has a different distance from the substrate 170). To further illustrate, a first interface 164 of the resistive material 160 and the first electrode 158 is substantially perpendicular to the surface 172 of the substrate 170. A second interface 166 of the resistive material 160 and the second electrode 162 is substantially perpendicular to the surface 172 of the substrate 170.

A first self-aligned contact (SAC) 154 and a second SAC 156 may be formed adjacent to the resistance-based storage element 104, the access transistor 108, and the dielectric region 152. Each of the SACs 154, 156 is configured to couple the resistance-based storage element 104 to the access transistor 108 in parallel. For example, FIG. 1 depicts that a first sidewall of the first SAC 154 is adjacent to (e.g., contacts) a source or drain (S/D) region of the access transistor 108 and is also adjacent to (e.g., contacts) the first electrode 158. As another example, a second sidewall of the second SAC 156 is adjacent to (e.g., contacts) another S/D region of the access transistor 108 and is also adjacent to (e.g., contacts) the second electrode 162.

During fabrication of the RRAM device 100, the SACs 154, 156 may be formed within cavities (e.g., by depositing metal material within etched regions). In the manufacturing process, an etch process used to form the cavities may be imperfect, e.g., "misaligned" or "overshoot". To illustrate, the etch process may partially etch into the electrodes 158, 162. If the resistance-based storage element 104 is designed to be coupled to the access transistor 108 in series (e.g., using another metal layer), then filling the SACs 154, 156 may cause an unintended short between the resistance-based storage element 104 and the access transistor 108.

The electrodes 158, 162 of FIG. 1 may function as a "mask" (or as spacers) during the etch process, which can reduce or eliminate cost associated with a separate mask for the etch process. Further, the parallel configuration of the resistance-based storage element 104 and the access transistor 108 may reduce a number of interconnects (e.g., metal wires, such as a crossbar array) to access the plurality of resistance-based storage elements 102, thus reducing device cost and circuit area.

To further illustrate, certain aspects of an illustrative example of a fabrication process are described with reference to FIGS. 2-17. It should be appreciated that the fabrication process is illustrative and that other fabrication processes are within the scope of the disclosure.

Figure 2A:
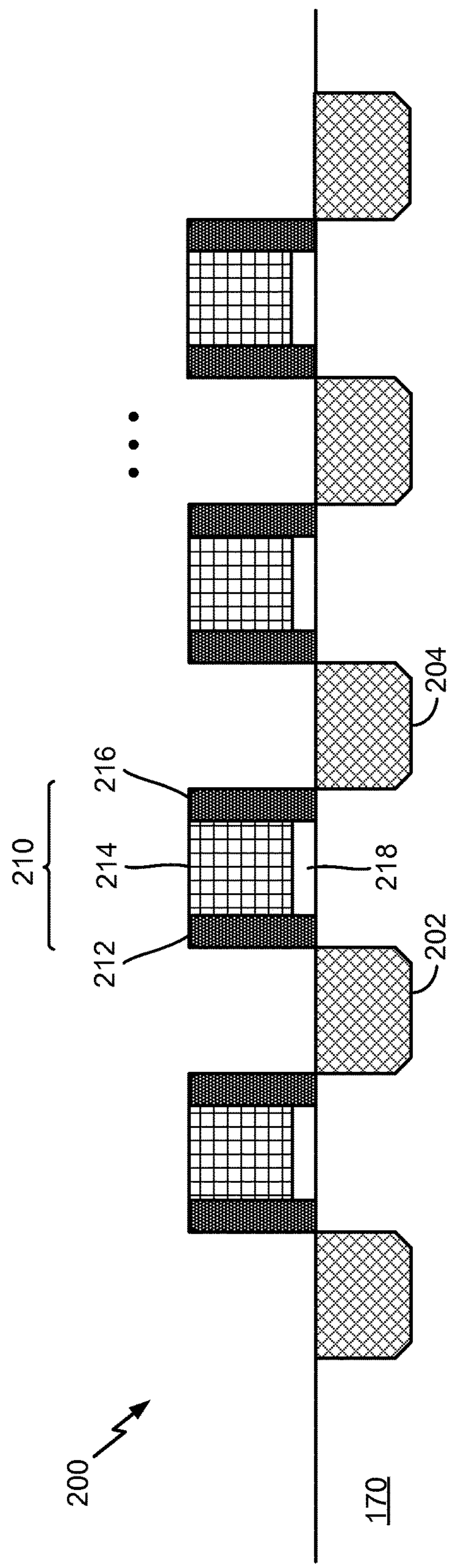
FIG. 2A depicts a cross-sectional view of an illustrative example of a device, such as the device of FIG. 1, during a first stage of a fabrication process.

FIG. 2A illustrates a device 200 during a first stage of the fabrication process. The device 200 may include the substrate 170 described with reference to FIG. 1. A plurality of source or drain regions may be formed in the substrate 170 (e.g., using a doping process, an implant process, or an epitaxy process). For example, FIG. 2A illustrates that the substrate 170 may include a representative source-or-drain (S/D) region 202 and a representative drain-or-source (D/S) region 204. The S/D region 202 may correspond to a first terminal (e.g., a source terminal) of the access transistor 108 of FIG. 1, and the D/S region 204 may correspond to a second terminal of the access transistor 108 (e.g., a drain terminal).

The device 200 may further include a dummy gate structure 210. The dummy gate structure 210 may include spacers 212, 216, a polysilicon region 214, and a region 218 (e.g., an etch stop material or another material). The spacers 212, 216 may be formed using a conformal deposition process followed by a directional etch process, such as a spacer process. The dummy gate structure 210 may be formed in connection with a replacement metal gate (RMG) process, as an illustrative example. In an alternative implementation, the device 200 may include transistors formed using a complementary metal-oxide semiconductor (CMOS) process that forms transistors having polysilicon gates. The device 200 may include one or more shallow trench isolation (STI) regions (not shown in FIG. 2A).

Figure 2B:
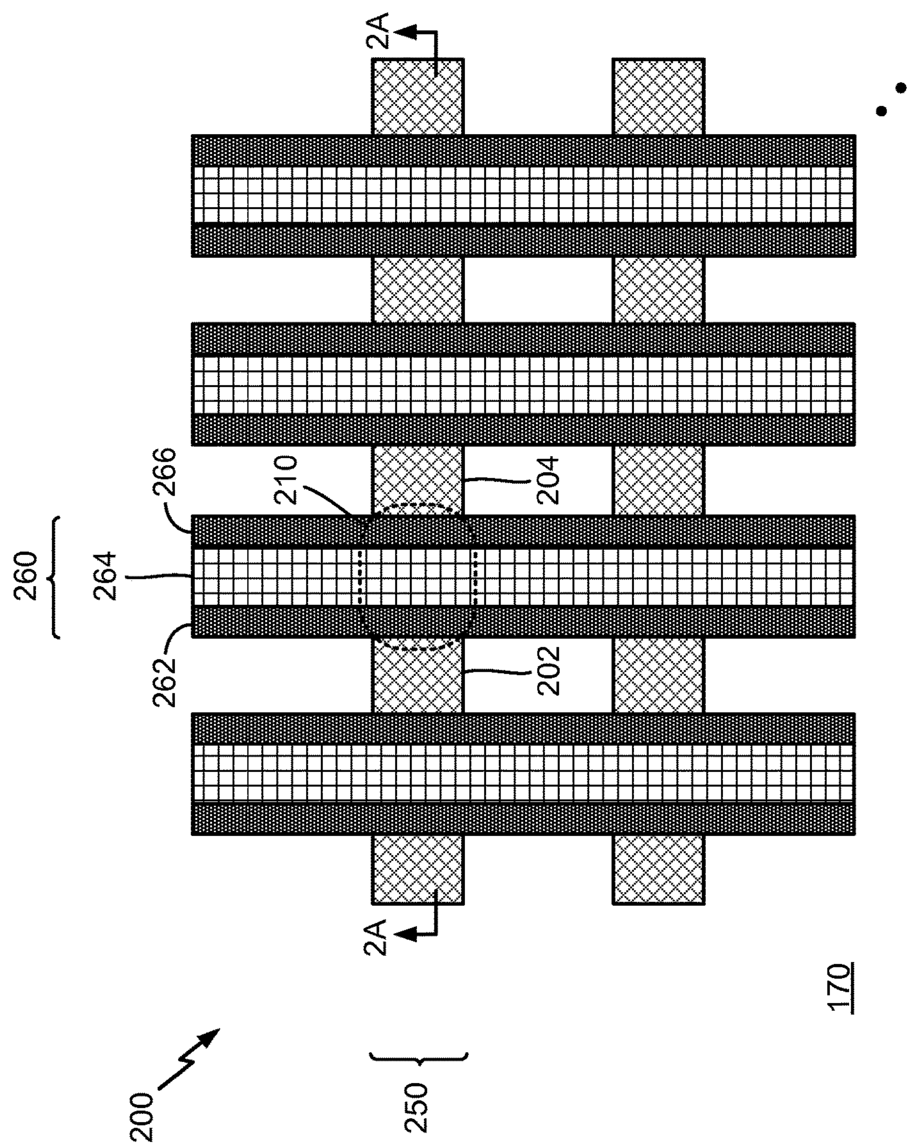
FIG. 2B depicts an overhead view of the device of FIG. 2A.

FIG. 2B illustrates an overhead view of the device 200 of FIG. 2A. FIG. 2B illustrates that the device 200 may include multiple active areas (e.g., highly doped regions), such as an active area 250. The active area 250 may include the S/D region 202 and the D/S region 204 of FIG. 2A.

FIG. 2B also illustrates that the device 200 may include multiple dummy gate structures, such as a dummy gate region 260. The dummy gate region 260 includes the dummy gate structure 210 of FIG. 2A. To illustrate, the dummy gate region 260 may include a spacer region 262 including the spacer 212 of FIG. 2A, a polysilicon region 264 including the polysilicon region 214 of FIG. 2A, and a spacer region 266 including the spacer 216 of FIG. 2A.

Figure 3:
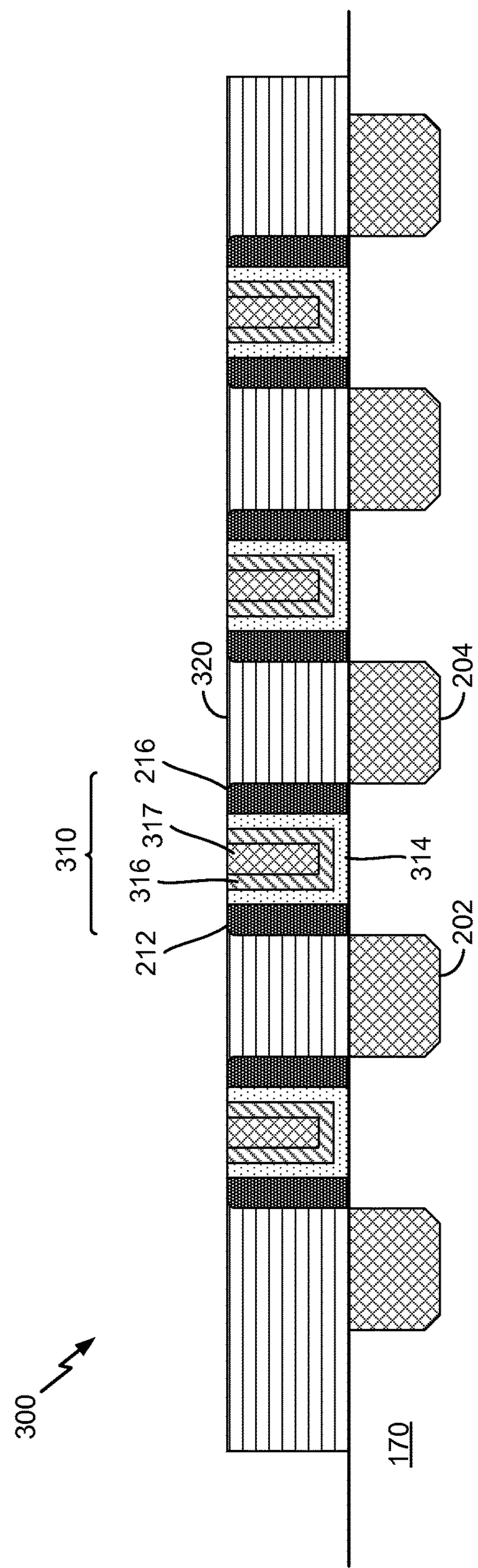
FIG. 3 depicts a cross-sectional view of an illustrative example of a device during a second stage of the fabrication process.

FIG. 3 illustrates a device 300 during a second stage of the fabrication process. In FIG. 3, a replacement metal gate (RMG) structure 310 has been formed by removing (e.g., etching) one or more of the regions 214, 218 of FIG. 2A and by forming (e.g., depositing) a dielectric material 314, a work function material 316, and a conductive gate material 317. To illustrate, the dielectric material 314 may include a high-k dielectric material (where k indicates a dielectric constant), and the conductive gate material 317 may include a metal gate material.

FIG. 3 also illustrates that a dielectric material 320 (e.g., an oxide material) may be formed on the substrate 170. In some implementations, one or more of the RMG structure 310 or the dielectric material 320 may be planarized using a planarization process. For example, if a thickness of the dielectric material 320 is greater than a thickness of the RMG structure 310, an "excess" amount of the dielectric material 320 may be planarized (so that the RMG structure 310 and the dielectric material 320 have approximately the same thickness).

Figure 4:
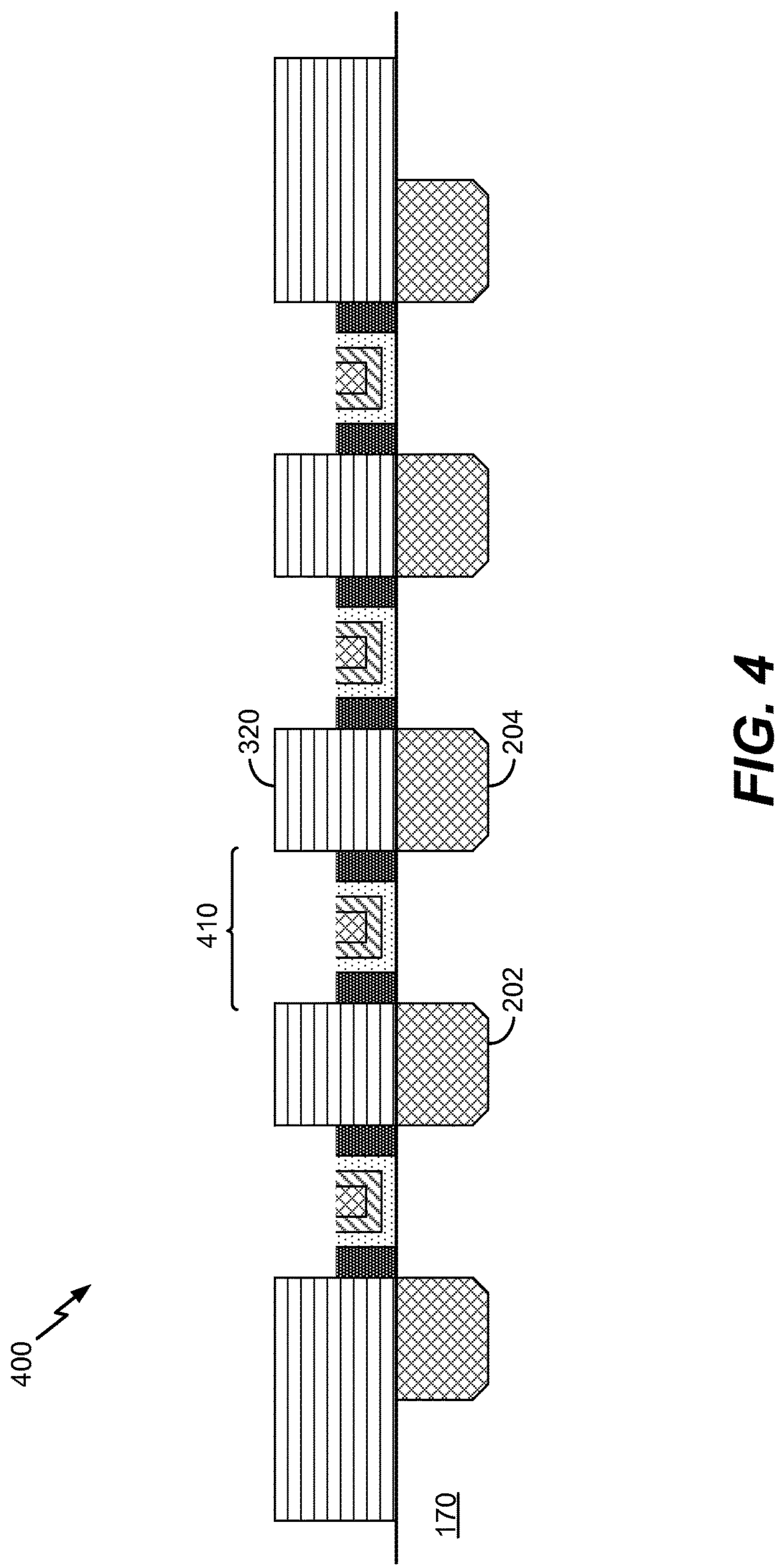
FIG. 4 depicts a cross-sectional view of an illustrative example of a device during a third stage of the fabrication process.

FIG. 4 illustrates a device 400 during a third stage of the fabrication process. FIG. 4 depicts that a portion of the RMG structure 310 of FIG. 3 has been removed (e.g., etched using an etch process) to define a recess 410. The portion of the RMG structure 310 may be removed using a mask or a selective etch process (e.g., to reduce or avoid etching of the dielectric material 320).

Figure 5:
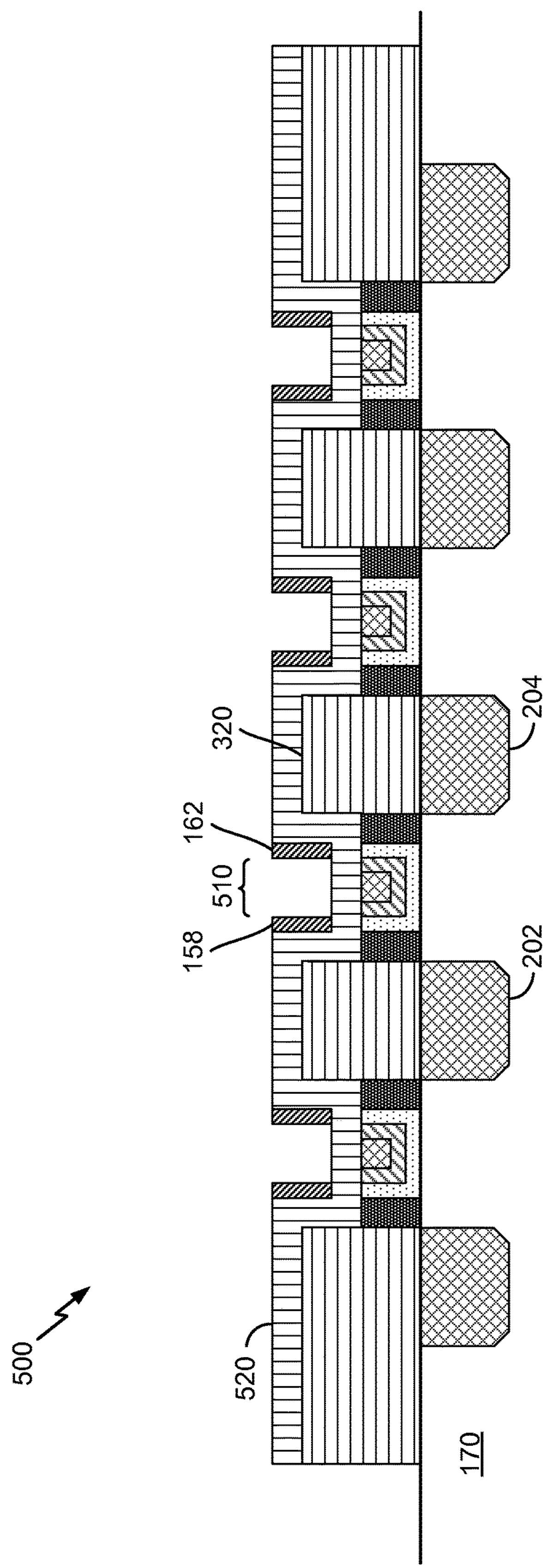
FIG. 5 depicts a cross-sectional view of an illustrative example of a device during a fourth stage of the fabrication process.

FIG. 5 illustrates a device 500 during a fourth stage of the fabrication process. FIG. 5 depicts that a dielectric layer 520 has been formed (e.g., using a conformal deposition process). For example, portions of the dielectric layer 520 may be formed on the dielectric material 320 and within the recess 410 of FIG. 4 (e.g., on sidewalls of the recess 410). The dielectric layer 520 may include a silicon nitride material, as an illustrative example. The dielectric layer 520 may correspond to a first interlayer dielectric (e.g., ILD0).

The device 500 may also include the electrodes 158, 162 described with reference to FIG. 1. To illustrate, the electrodes 158, 162 may be formed by depositing a conductive material (e.g., using a non-conformal deposition process) within the recess 410 of FIG. 4. As an illustrative, non-limiting example, the electrodes 158, 162 may be formed using a spacer process, such as a same (or similar) spacer process used to form the spacers 212, 216 of FIG. 2A. The electrodes 158, 162 may define a cavity 510 (e.g., the cavity 510 may separate the first electrode 158 from the second electrode 162).

Figure 6:
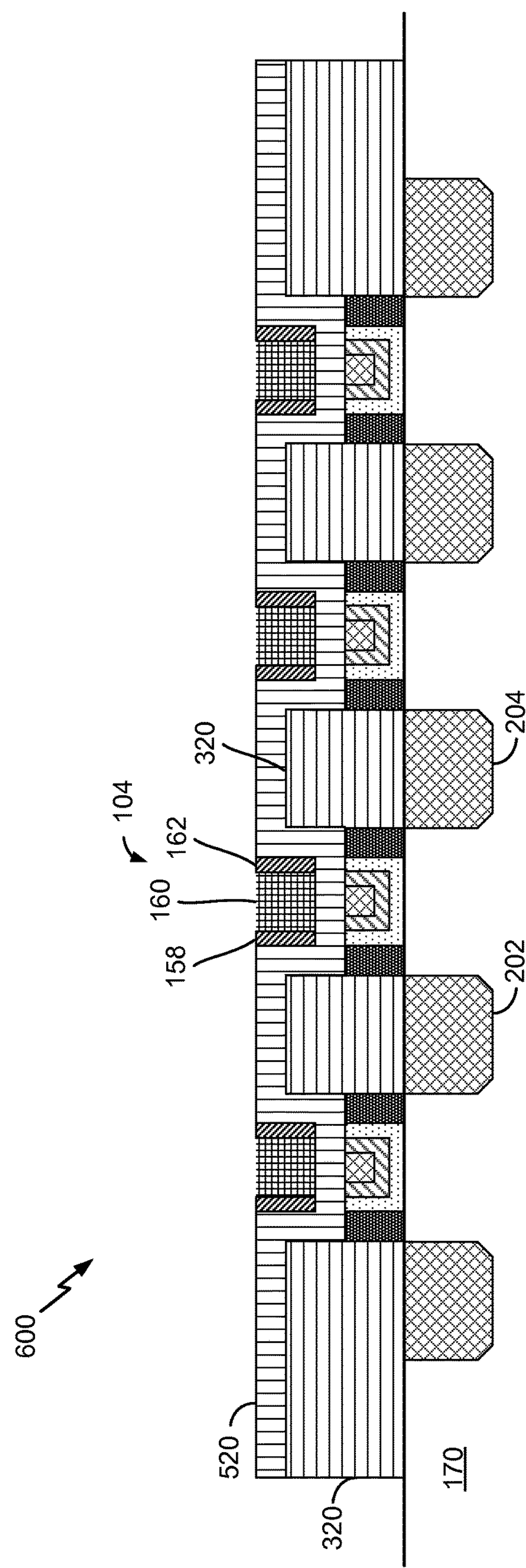
FIG. 6 depicts a cross-sectional view of an illustrative example of a device during a fifth stage of the fabrication process.

FIG. 6 illustrates a device 600 during a fifth stage of the fabrication process. FIG. 6 depicts that the resistive material 160 has been formed within the cavity 510 of FIG. 5. For example, a resistive layer may be formed (e.g., using a deposition process), and the resistive layer may be planarized to form the resistive material 160. The resistive material 160 may include a resistive oxide material, such as a particular resistive oxide material selected for an RRAM application. As an illustrative example, the resistive material 160 may include a copper-oxide (Cu—O) material, or a tantalum-oxide (Ta—O) material.

Figure 7:
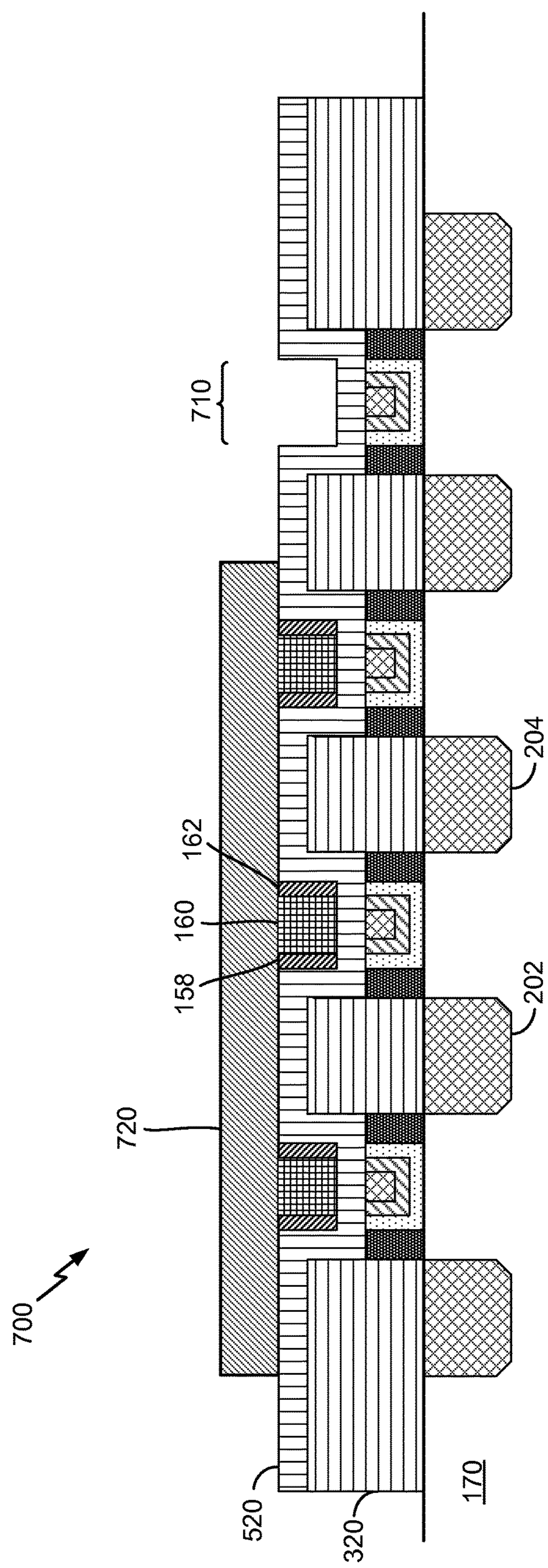
FIG. 7 depicts a cross-sectional view of an illustrative example of a device during a sixth stage of the fabrication process.

FIG. 7 illustrates a device 700 during a sixth stage of the fabrication process. FIG. 7 depicts that a photoresist material 720 has been formed (e.g., spin coated) on a portion of the dielectric layer 520. The photoresist material 720 may be patterned (e.g., using a mask and a lithographic process) to define a particular shape of the photoresist material 720. The photoresist material 720 may adjoin surfaces (e.g., top surfaces) of the electrodes 158, 162 and the resistive material 160.

FIG. 7 also illustrates that a region 710 has been selectively defined in the dielectric layer 520. For example, the region 710 may be created by applying a selective etch process that exposes a surface of the dielectric layer 520 by removing electrode material and resistive material within the region 710 after the photoresist material 720 is applied at the device 700. The selective etch process may remove electrode material and resistive material from region 710 (while the photoresist material 720 protects other components, such as the electrodes 158, 162 and the resistive material 160). The region 710 may correspond to a region in which a select transistor (e.g., the select transistor 118 of FIG. 1) is to be formed. In another illustrative fabrication process, a selective etch process is used to remove the resistive material from the region 710 without removing electrode material from the region 710.

Figure 8:
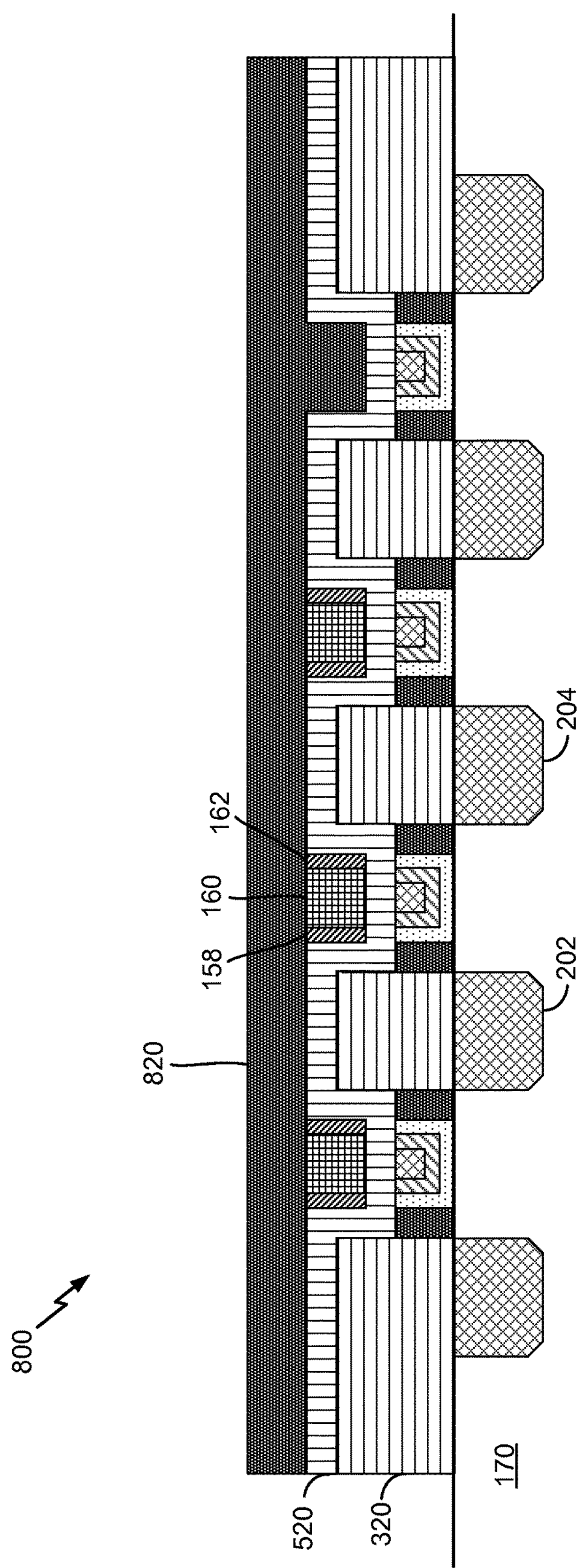
FIG. 8 depicts a cross-sectional view of an illustrative example of a device during a seventh stage of the fabrication process.

FIG. 8 illustrates a device 800 during a seventh stage of the fabrication process. FIG. 8 depicts that the photoresist material 720 of FIG. 7 has been removed (e.g., stripped). FIG. 8 also depicts that a dielectric layer 820 has been formed (e.g., deposited) on surfaces of the dielectric layer 520, the electrodes 158, 162, and the resistive material 160. The dielectric layer 820 may correspond a second interlayer dielectric (e.g., ILD1). The dielectric layer 820 may include a silicon nitride material, as an illustrative example.

Figure 9:
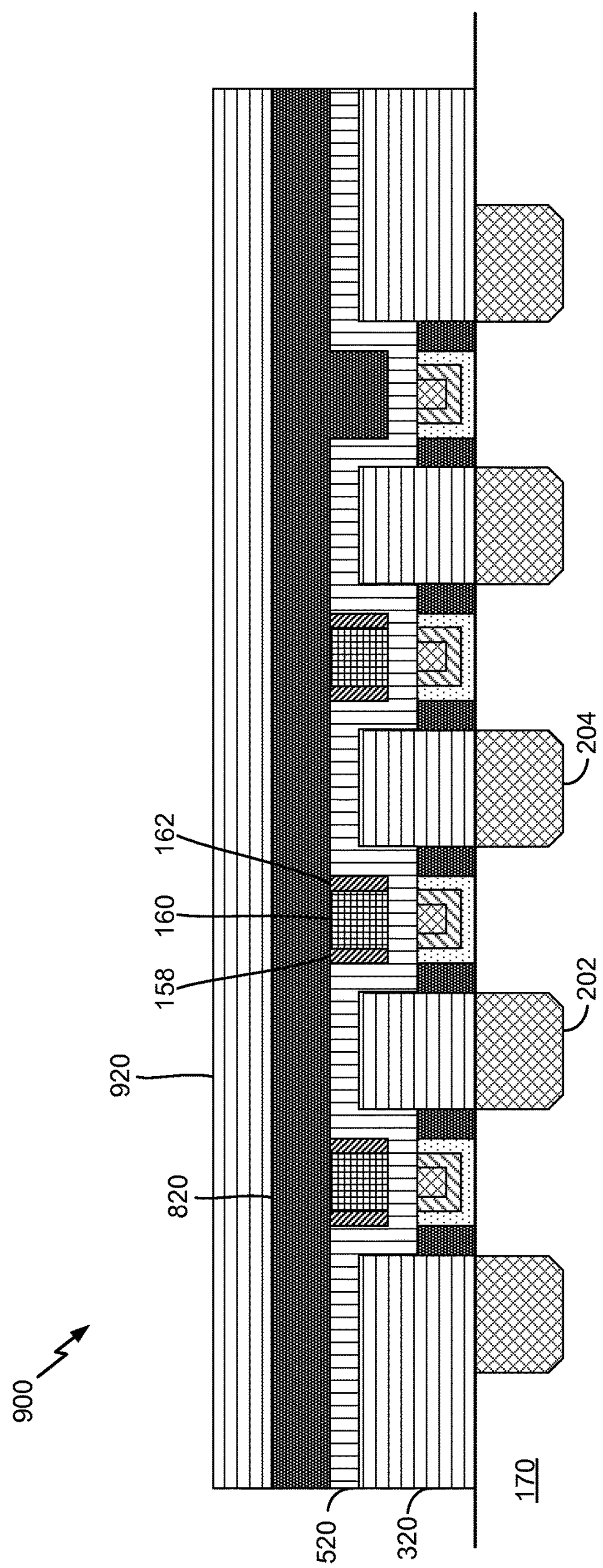
FIG. 9 is a diagram illustrating a cross-sectional view of an illustrative example of a device during an eighth stage of the fabrication process.

FIG. 9 illustrates a device 900 during an eighth stage of the fabrication process. FIG. 9 depicts that a dielectric layer 920 has been formed on the dielectric layer 820. For example, the dielectric layer 920 may correspond to a third interlayer dielectric (e.g., ILD2). The dielectric layer 920 may include a silicon oxide material, as an illustrative example.

Figure 10A:
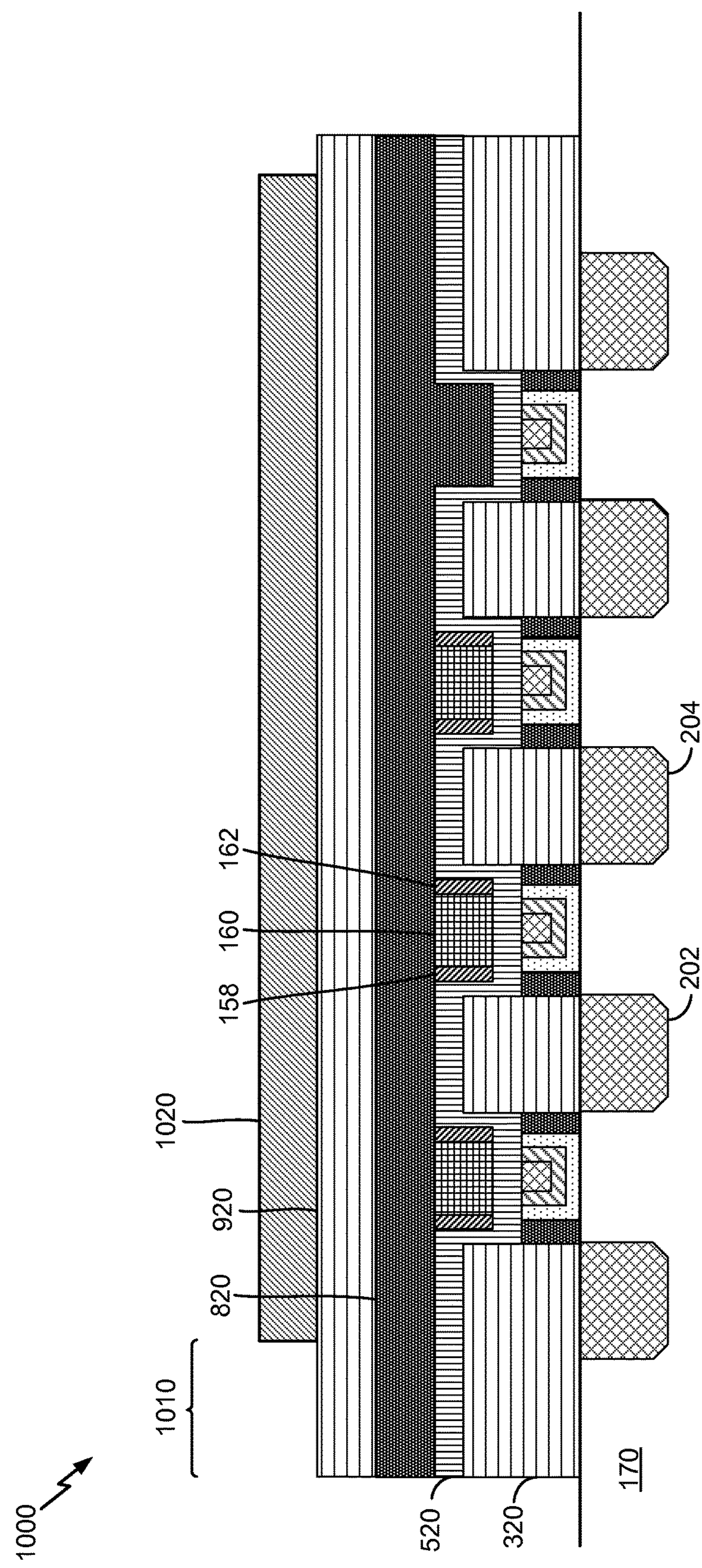
FIG. 10A depicts a cross-sectional view of an illustrative example of a device during a ninth stage of the fabrication process.

FIG. 10A illustrates a device 1000 during a ninth stage of the fabrication process. FIG. 10A depicts that a photoresist material 1020 has been formed (e.g., spin coated) on the dielectric layer 920 and patterned (e.g., using a mask and a lithographic process). As an illustrative example, the photoresist material 1020 is patterned using the same photolithography mask(s) and process steps where self-aligned contact in other portion of the semiconductor die are patterned. FIG. 10A also depicts that a region 1010 of the dielectric layer 920 may be exposed (e.g., is not be covered or protected by the photoresist material 1020).

Figure 10B:
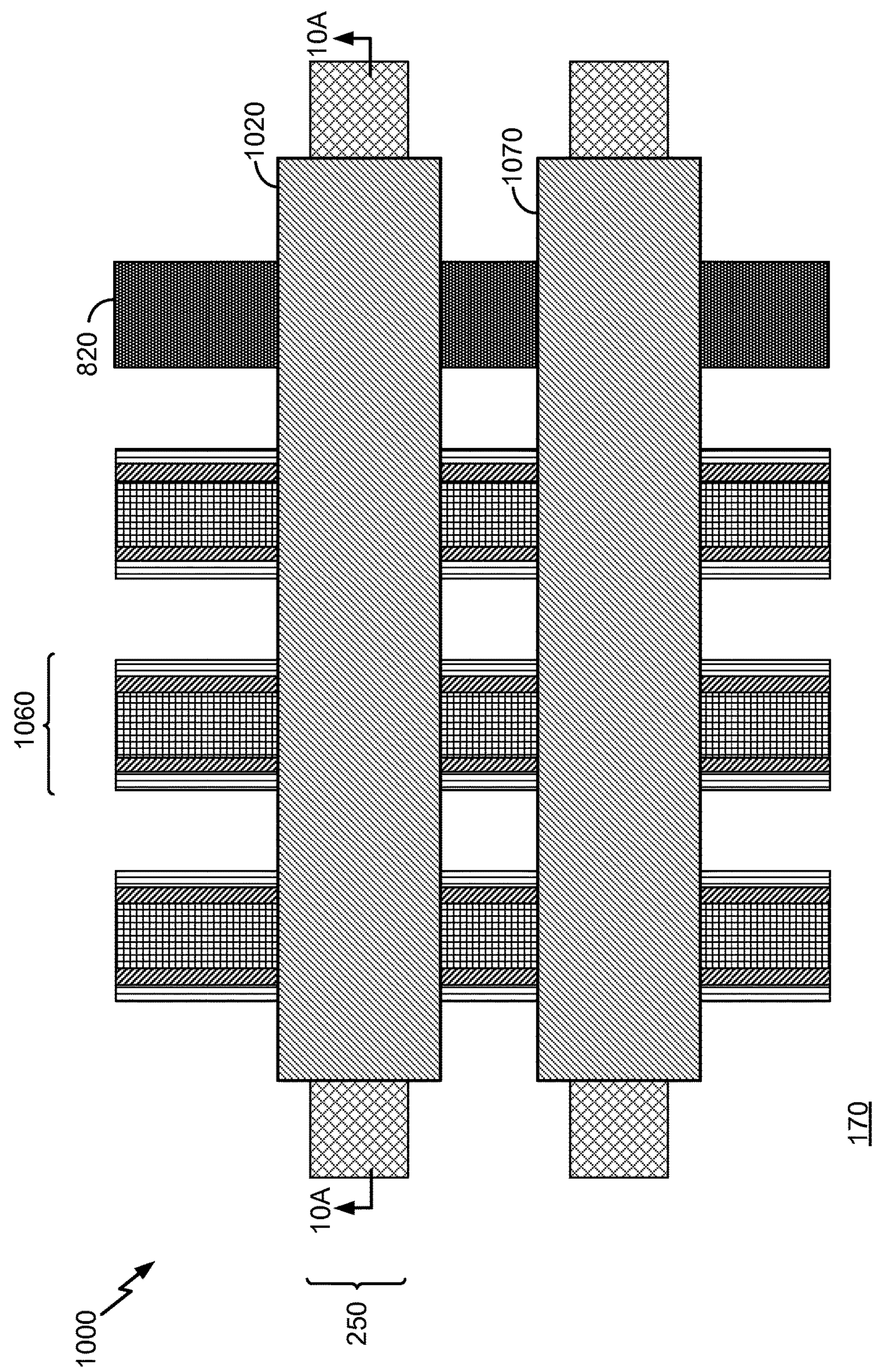
FIG. 10B depicts an overhead view of the device of FIG. 10A.

FIG. 10B illustrates an overhead view of the device 1000 of FIG. 10A. FIG. 10B depicts that the device 1000 may include the active area 250 of FIG. 2B (which includes the S/D region 202 and the D/S region 204).

FIG. 10B also illustrates that the device 1000 may include multiple storage element regions, such as a storage element region 1060. The storage element region 1060 may include the resistance-based storage element 104 (and the electrodes 158, 162 and the resistive material 160). The storage element region 1060 may be separated into multiple resistance-based storage elements (e.g., a row or column of resistance-based storage elements) at a later stage of the fabrication process, as described further below.

The device 1000 may also include the photoresist material 1020 of FIG. 10A and a photoresist material 1070. The photoresist material 1020 may be configured to protect a first group (e.g., a first "NAND" string) of resistance-based storage elements during an etch process, and the photoresist material 1070 may be configured to protect a second group (e.g., a second "NAND" string) of resistance-based storage elements during the etch process. For example, the etch process may remove portions of the storage element region 1060 that are not protected by the photoresist materials 1020, 1070. Removing portions of the storage element region 1060 using the etch process may define (e.g., separate) the resistance-based storage element 104 (which may be protected during the etch process by the photoresist material 1020) and at least a second resistance-based storage element (which may be protected during the etch process by the photoresist material 1070).

Figure 11:
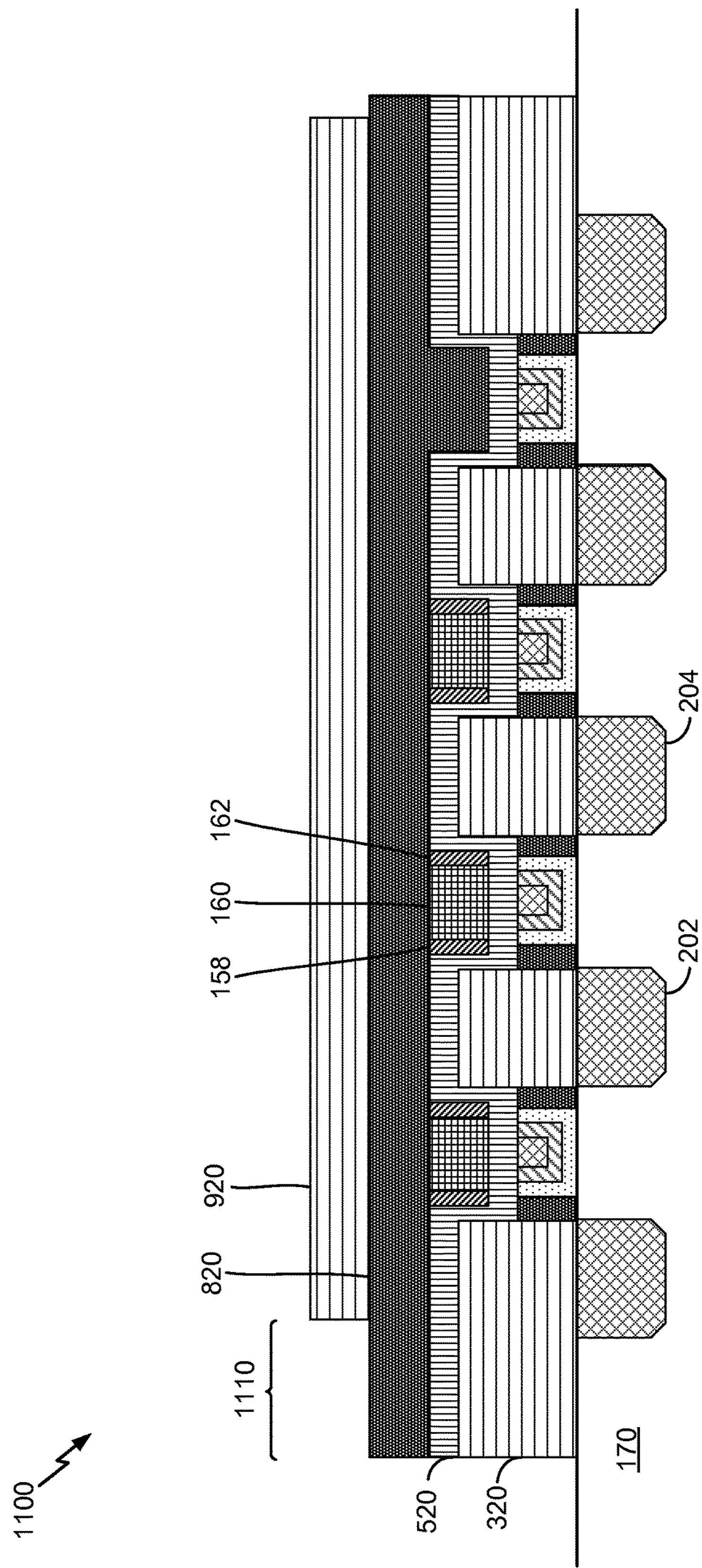
FIG. 11 depicts a cross-sectional view of an illustrative example of a device during a tenth stage of the fabrication process.

FIG. 11 illustrates a device 1100 during a tenth stage of the fabrication process. FIG. 11 depicts that the region 1010 of FIGS. 10A and 10B has been removed (e.g., etched using an etch process). Removing the region 1010 may expose a region 1110 of the dielectric layer 820. FIG. 11 also depicts that the photoresist material 1020 has removed (e.g., stripped).

Figure 12A:
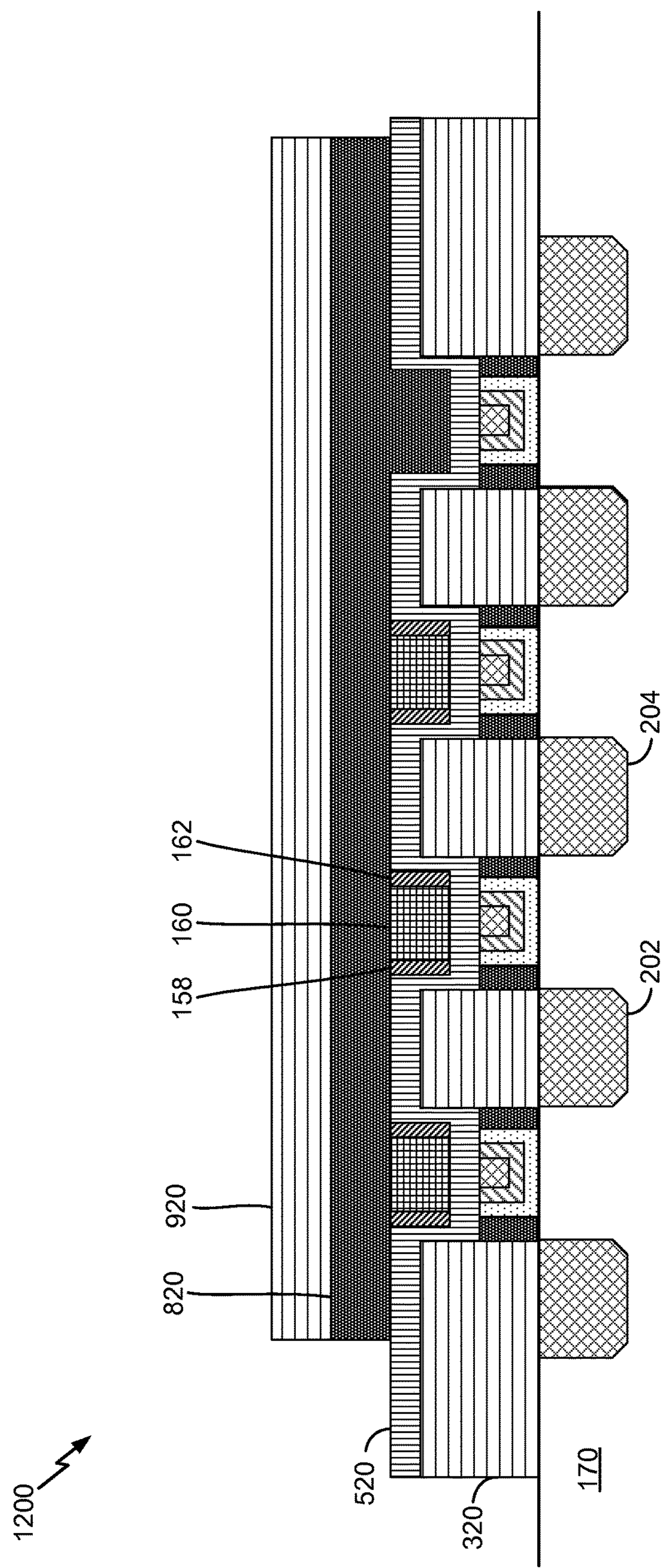
FIG. 12A depicts a cross-sectional view of an illustrative example of a device during an eleventh stage of the fabrication process.

FIG. 12A illustrates a device 1200 during an eleventh stage of the fabrication process. FIG. 12A depicts that the dielectric layer 820 of FIG. 8 in the region 1110 of FIG. 11 has been removed (e.g., etched using a selective etch process while the dielectric layers 820, 920 function as a mask for the selective etch process). For example, the selective etch process may etch electrode material and resistive material (e.g., portions of the electrodes 158, 162 and the resistive material 160) that are not protected by one or more of the dielectric layers 820, 920. As a result, the selective etch process of FIG. 12A may separate the storage element region 1060 of FIG. 10B into multiple separate storage elements regions (e.g., by "carving out" the resistance-based storage element 104 from the storage element region 1060).

Figure 12B:
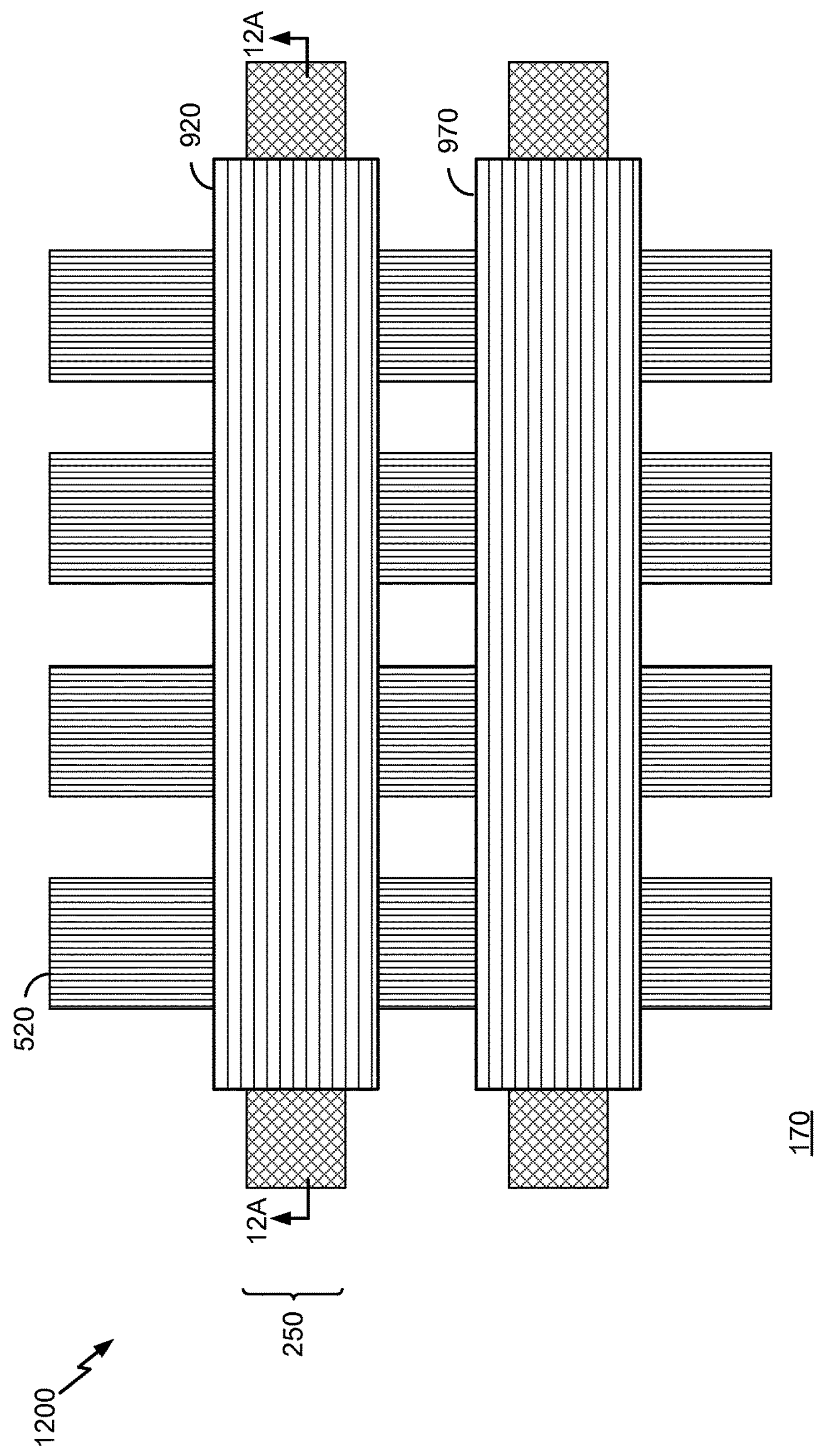
FIG. 12B depicts an overhead view of the device of FIG. 12A.

To further illustrate, FIG. 12B depicts an overhead view of the device 1200 of FIG. 12A. FIG. 12B illustrates that the dielectric layer 920 (and the dielectric layer 820 positioned below the dielectric layer 920) may protect the electrodes 158, 162 and the resistive material 160 during the selective etch process and that other portions of the storage element region 1060 of FIG. 10B may be etched (e.g., to expose surfaces of the dielectric layer 520). The dielectric layer 920 may function as a mask during the selective etch process to define materials of a row of resistance-based storage elements (e.g., the plurality of resistance-based storage elements 102 of FIG. 1). FIG. 12B also illustrates that a dielectric layer 970 may function as a mask during the selective etch process to define materials of another row of resistance-based storage elements.

Figure 13:
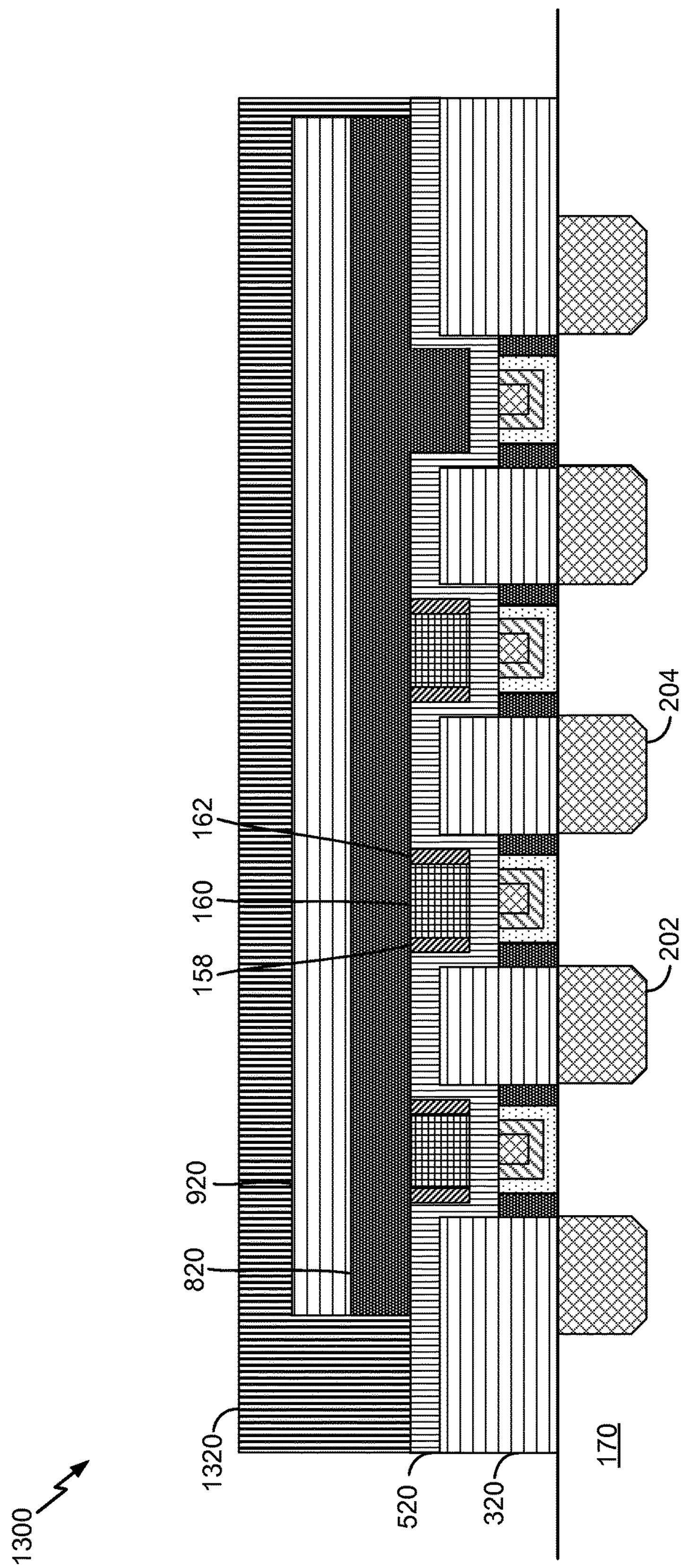
FIG. 13 depicts a cross-sectional view of an illustrative example of a device during a twelfth stage of the fabrication process.

FIG. 13 illustrates a device 1300 during a twelfth stage of the fabrication process. The device 1300 includes a dielectric layer 1320. The dielectric layer 1320 may correspond to a fourth interlayer dielectric (e.g., ILD3). For example, the dielectric layer 1320 may include an amorphous material, such an amorphous silicon (a-Si) or amorphous carbon (a-C), as illustrative examples.

Figure 14:
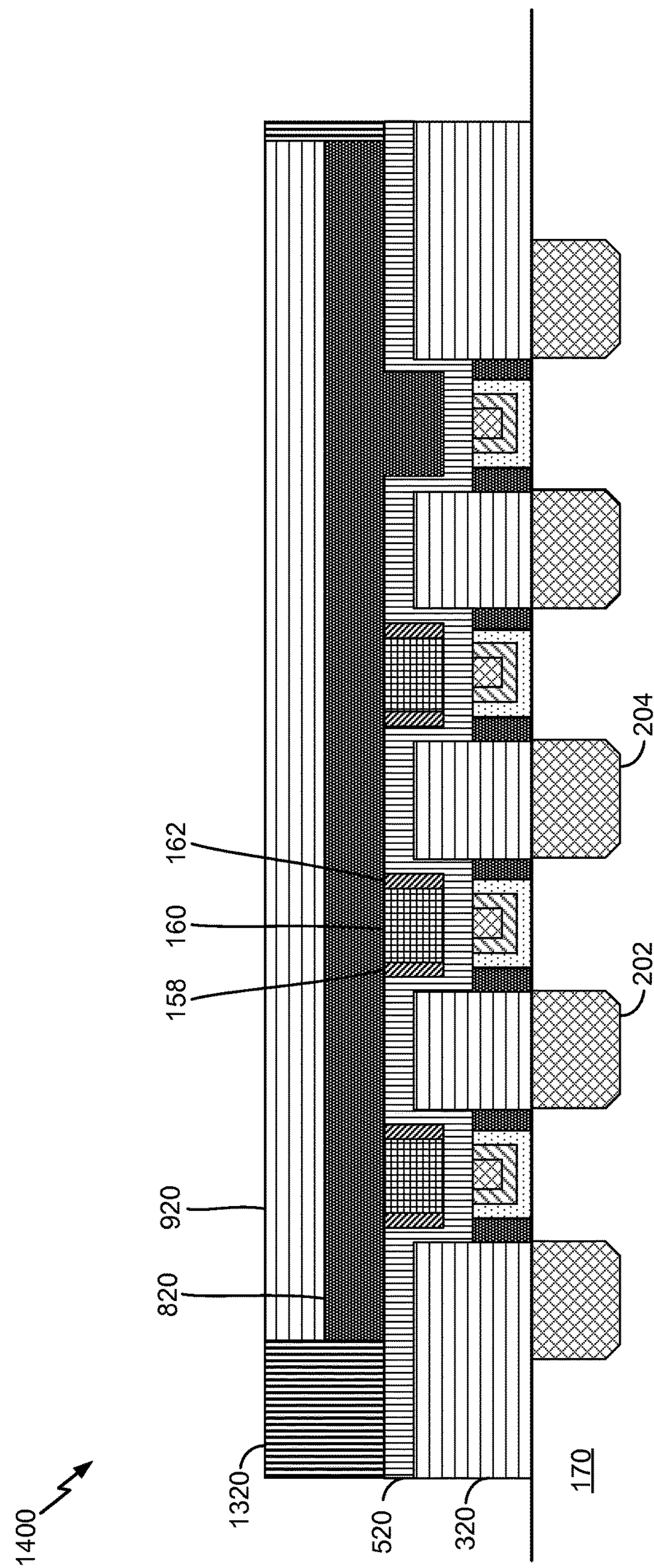
FIG. 14 depicts a cross-sectional view of an illustrative example of a device during a thirteenth stage of the fabrication process.

FIG. 14 illustrates a device 1400 during a thirteenth stage of the fabrication process. In FIG. 14, the dielectric layer 1320 of FIG. 13 has been planarized or polished, such as using a chemical-mechanical planarization (CMP) process, such that the top surface of the dielectric layer 1320 of FIG. 13 is at substantially the same level as the top surface of the dielectric layer 920 of FIG. 9. The top surface of the dielectric layer 920 of FIG. 9 may be partially or fully exposed.

Figure 15:
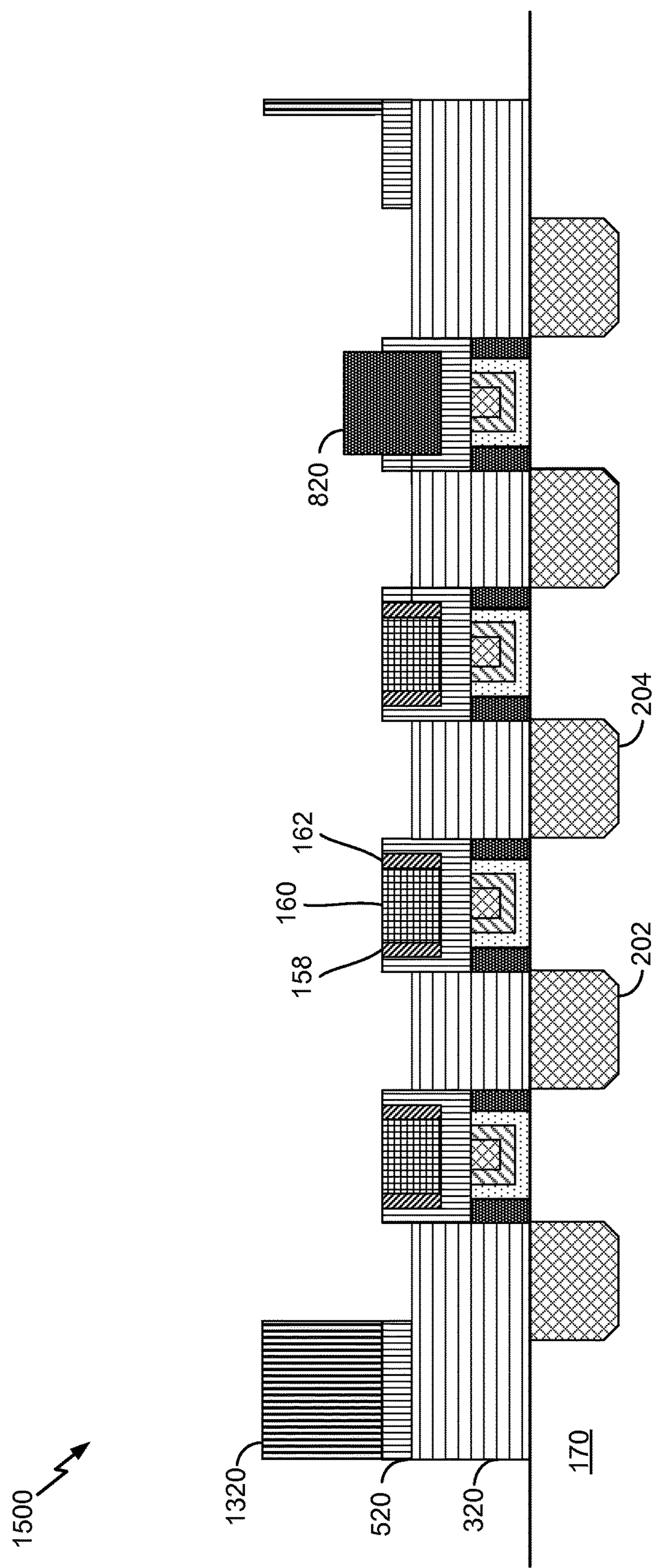
FIG. 15 depicts a cross-sectional view of an illustrative example of a device during a fourteenth stage of the fabrication process.

FIG. 15 illustrates a device 1500 during a fourteenth stage of the fabrication process. In FIG. 15, the dielectric layer 920 of FIGS. 9-14 has been etched (e.g., using a selective etch process). FIG. 15 also depicts that the dielectric layer 820 of FIG. 8 has been partially etched. FIG. 15 also depicts that the dielectric layer 520 of FIGS. 5-14 have been etched (e.g., using the same etch process used to etch the dielectric layer 920, or using one or more different etch processes). For example, etching the dielectric layer 520 may expose a portion of the dielectric layer 820.

Figure 16:
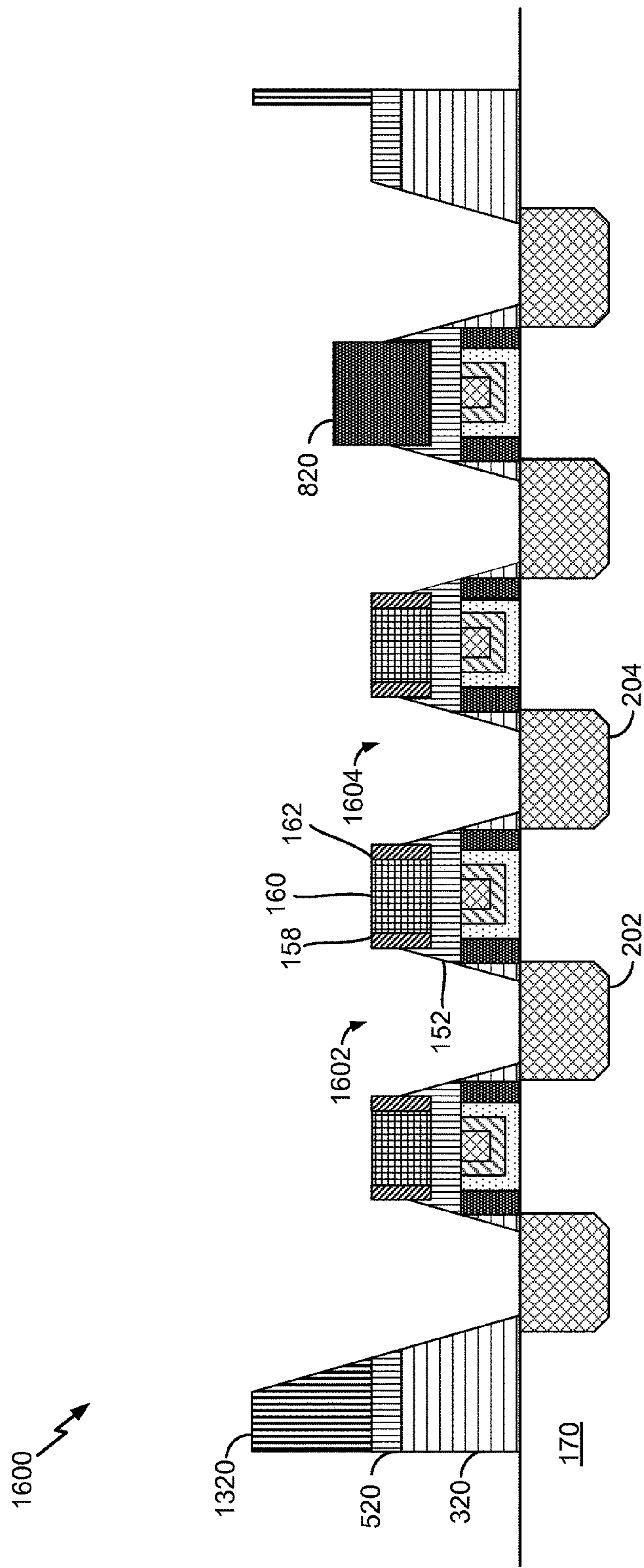
FIG. 16 depicts a cross-sectional view of an illustrative example of a device during a fifteenth stage of the fabrication process.

FIG. 16 illustrates a device 1600 during a fifteenth stage of the fabrication process. In FIG. 16, a plurality of regions (e.g., contact holes) have been defined (e.g., using an etch process). For example, FIG. 16 illustrates that a region 1602 and a region 1604 may be defined by using an etch process that etches the dielectric material 320 to expose a surface of the S/D region 202 and to expose a surface of the D/S region 204. The etch process may also define the dielectric region 152 of FIG. 1.

The etch process used to define the regions 1602, 1604 may have a particular etch selectivity that etches some materials (e.g., dielectric materials) without etching other materials (e.g., conductive materials, such as metals). To illustrate, FIG. 16 depicts that the dielectric region 152, the dielectric material 320, the dielectric layer 520, and the dielectric layer 1320 have been partially etched by the etch process. FIG. 16 also illustrates that electrodes of the device 1600 (e.g., the electrodes 158, 162) have not been etched (or have not been etched substantially). Materials of the electrodes 158, 162 may have a greater etch resistance to the etch process as compared to etch resistances of other materials (e.g., dielectric materials) of the device 1600. In this case, the electrodes 158, 162 may function as a mask during the etch process. Because the electrodes 158, 162 and the resistive material 160 have an in-plane configuration (e.g., where the electrodes 158, 162 and the resistive material 160 are formed "side-by-side" instead of being formed on top of one another), the electrodes 158, 162 may be configured to protect the resistive material 160 from being etched during the etch process.

Figure 17A:
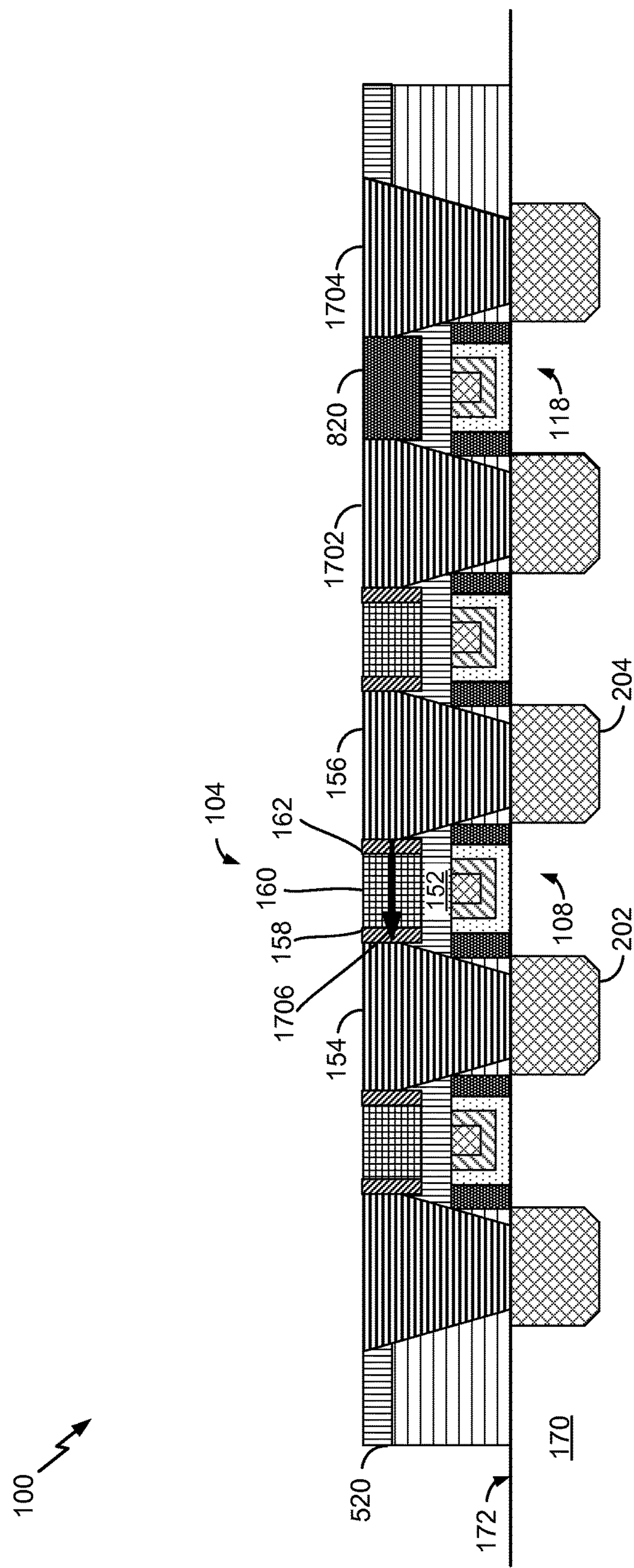
FIG. 17A depicts a cross-sectional view of an illustrative example of a device during a sixteenth stage of the fabrication process.

FIG. 17A illustrates a cross-sectional view of the RRAM device 100 of FIG. 1 during a sixteenth stage of the fabrication process. In FIG. 17A, a plurality of SACs have been formed within the plurality of regions described with reference to FIG. 16. For example, FIG. 17A illustrates that the first SAC 154 may be formed in the region 1602 of FIG. 16. As another example, FIG. 17A depicts that the second SAC 156 may be formed in the region 1604 of FIG. 16. The SACs 154, 156 may be formed using a deposition process, such as a chemical vapor deposition (CVD) process. As an additional example, the SACs 154, 156 may be formed by depositing a contact material (e.g., tungsten) in the regions 1602, 1604 of FIG. 16 using a CVD process. A planarization or polishing process may be performed to remove the contact material on the top surface of the wafer to expose and smooth or flatten a surface of the RRAM device 100 (e.g., to smooth or remove one or more dielectric materials of the RRAM device 100, such as the dielectric layer 1320 of FIGS. 13-16).

Forming the SACs 154, 156 may connect the S/D region 202 to the first electrode 158 and may connect the D/S region 204 to the second electrode 162 to the form the access transistor 108 of FIG. 1. The access transistor 108 is coupled in parallel to the resistance-based storage element 104. A sidewall of the first SAC 154 may be adjacent to the first electrode 158, and a sidewall of the second SAC 156 may be adjacent to the second electrode 162.

The second electrode 162 may be configured to provide a current 1706 to the first electrode 158 through the resistive material 160. The current 1706 may be oriented substantially parallel to the surface 172 of the substrate 170.

Figure 17B:
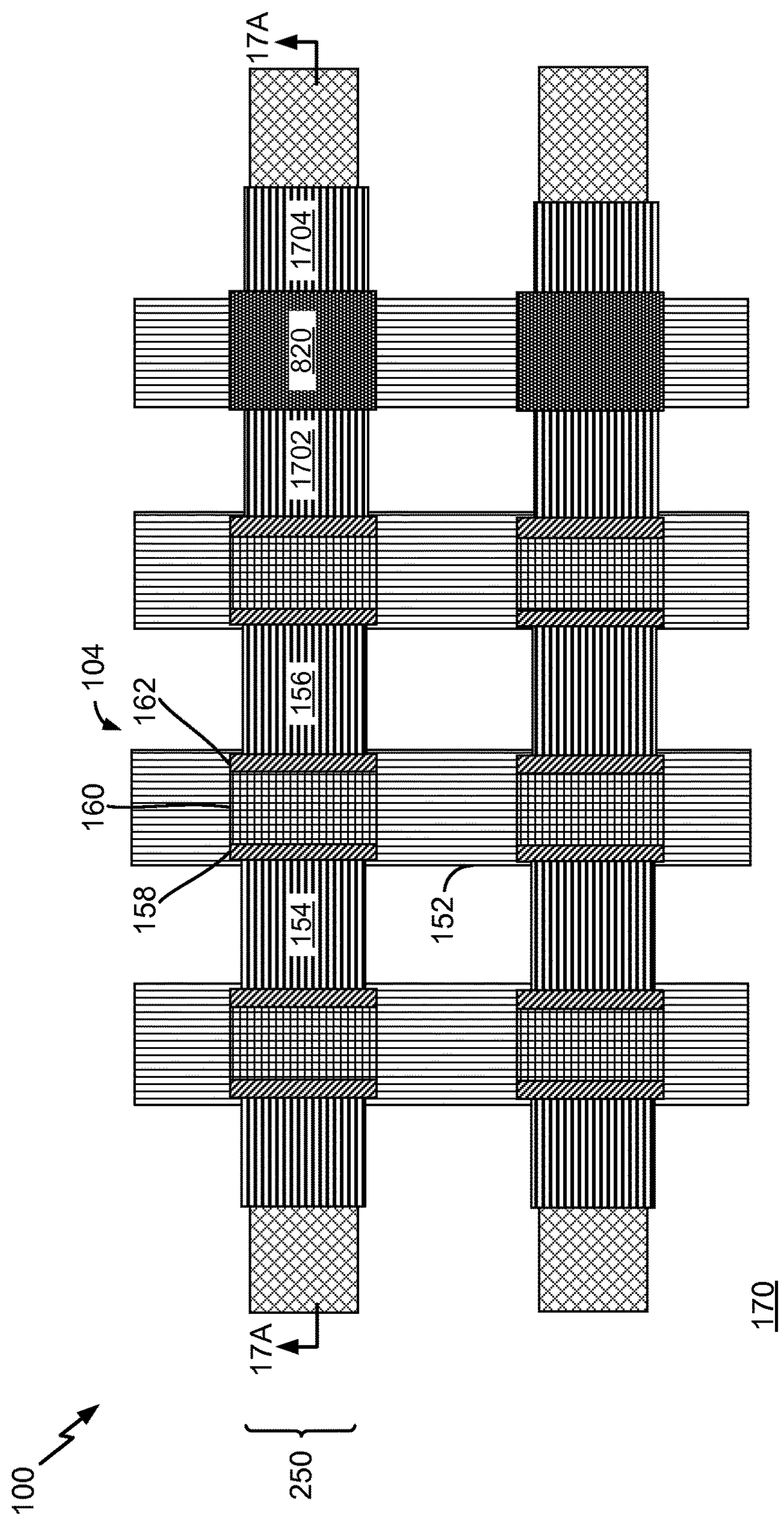
FIG. 17B illustrates an overhead view of the device of FIG. 17A.

FIG. 17A also depicts SACs 1702, 1704. The SACs 1702, 1704 may be connected to terminals (e.g., source and drain terminals) of the select transistor 118 but may be isolated from the gate by remaining dielectric material 820 of FIG. 8, dielectric material 520 of FIG. 5, and spacer material 212, 216 of FIG. 2. To further illustrate, FIG. 17B depicts an overhead view of the RRAM device 100.

The fabrication process described above may enable efficient fabrication of an RRAM device that includes RRAM storage elements connected to access transistors in parallel. For example, use the SACs 154, 156 in connection with an in-plane configuration of the resistance-based storage element 104 may enable the electrodes 158, 162 to protect the resistive material 160 during one or more of an etch process or a deposition process. The electrodes 158, 162 may function as a mask during the fabrication process, which may reduce fabrication cost associated with use of an additional mask.

Figure 18:
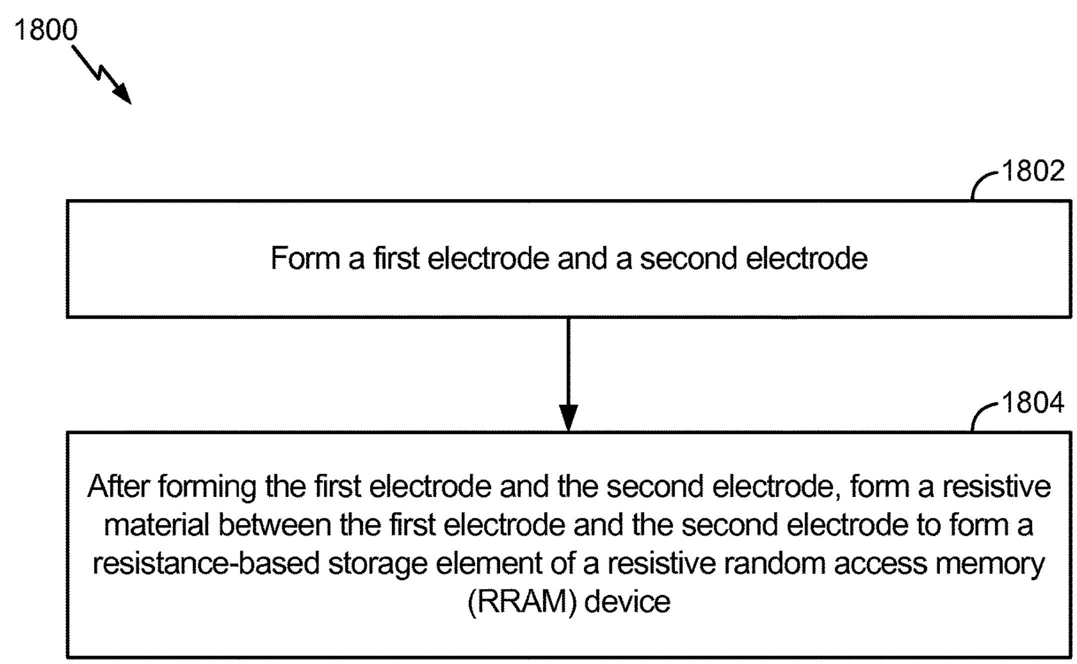
FIG. 18 is a flow diagram of an illustrative method of fabrication of a device that includes a SAC and a resistance-based storage element.

Referring to FIG. 18, an illustrative example of a method of fabricating a device is depicted and generally designated 1800. For example, the method 1800 may be performed by a processor executing instructions to fabricate the RRAM device 100. For example, the method 1800 may include one or more operations described above with reference to the illustrative fabrication process to fabricate the RRAM device 100.

The method 1800 may include forming a first electrode (e.g., the first electrode 158) and a second electrode (e.g., the second electrode 162), at 1802. For example, the first electrode 158 and the second electrode 162 may be formed concurrently using a non-conformal deposition process to deposit conductive material on sidewalls of a recess (e.g., the recess 410) of a dielectric material (e.g., the dielectric material 320).

The method 1800 may further include, after forming the first electrode and the second electrode, forming a resistive material (e.g., the resistive material 160) between the first electrode and the second electrode to form a resistance-based storage element (e.g., the resistance-based storage element 104) of an RRAM device (e.g., the RRAM device 100), at 1804. To further illustrate, the first interface 164 of the resistive material 160 and the first electrode 158 may be substantially perpendicular to the surface 172 of the substrate 170. The second interface 166 of the resistive material 160 and the second electrode 162 may be substantially perpendicular to the surface 172 of the substrate 170.

The method 1800 may optionally include forming a gate structure (e.g., the RMG structure 310) of an access transistor (e.g., the access transistor 108) associated with the resistance-based storage element and may also include forming a dielectric material (e.g., the dielectric region 152) on the gate structure. The first electrode, the second electrode, and the resistive material may be formed on the dielectric material. For example, the method 1800 may include etching the dielectric material to create a recess (e.g., the recess 410), and the first electrode and the second electrode may be formed on sidewalls of the recess (e.g., using a non-conformal deposition process).

The method 1800 may include performing an etch process to define a first etched region (e.g., the region 1602) and a second etched region (e.g., the region 1604) that are adjacent to the resistance-based storage element. In this example, the first electrode and the second electrode function as a mask during the etch process. The method 1800 may also include forming a first SAC (e.g., the first SAC 154) within the first etched region and a second SAC (e.g., the second SAC 156) within the second etched region. The first SAC may be coupled to the first electrode and to a first terminal (e.g., the S/D region 202) of an access transistor (e.g., the access transistor 108) associated with the resistance-based storage element. The second SAC may be coupled to the second electrode and to a second terminal (e.g., the D/S region 204) of the access transistor.

One or more operations of the method 1800 may be initiated, controlled, or performed using a processor that executes instructions. For example, forming the access transistor, the first electrode, the second electrode, and the resistive material, may be initiated by a processor executing instructions. One or more operations of the method 1800 may be initiated, controlled, or performed by a field-programmable gate array (FPGA) device, an application-specific integrated circuit (ASIC), a processing unit such as a central processing unit (CPU), a digital signal processor (DSP), a controller, another hardware device, a firmware device, or a combination thereof. Illustrative examples of processors that execute instructions to initiate fabrication operations are described further with reference to FIG. 20.

Figure 19:
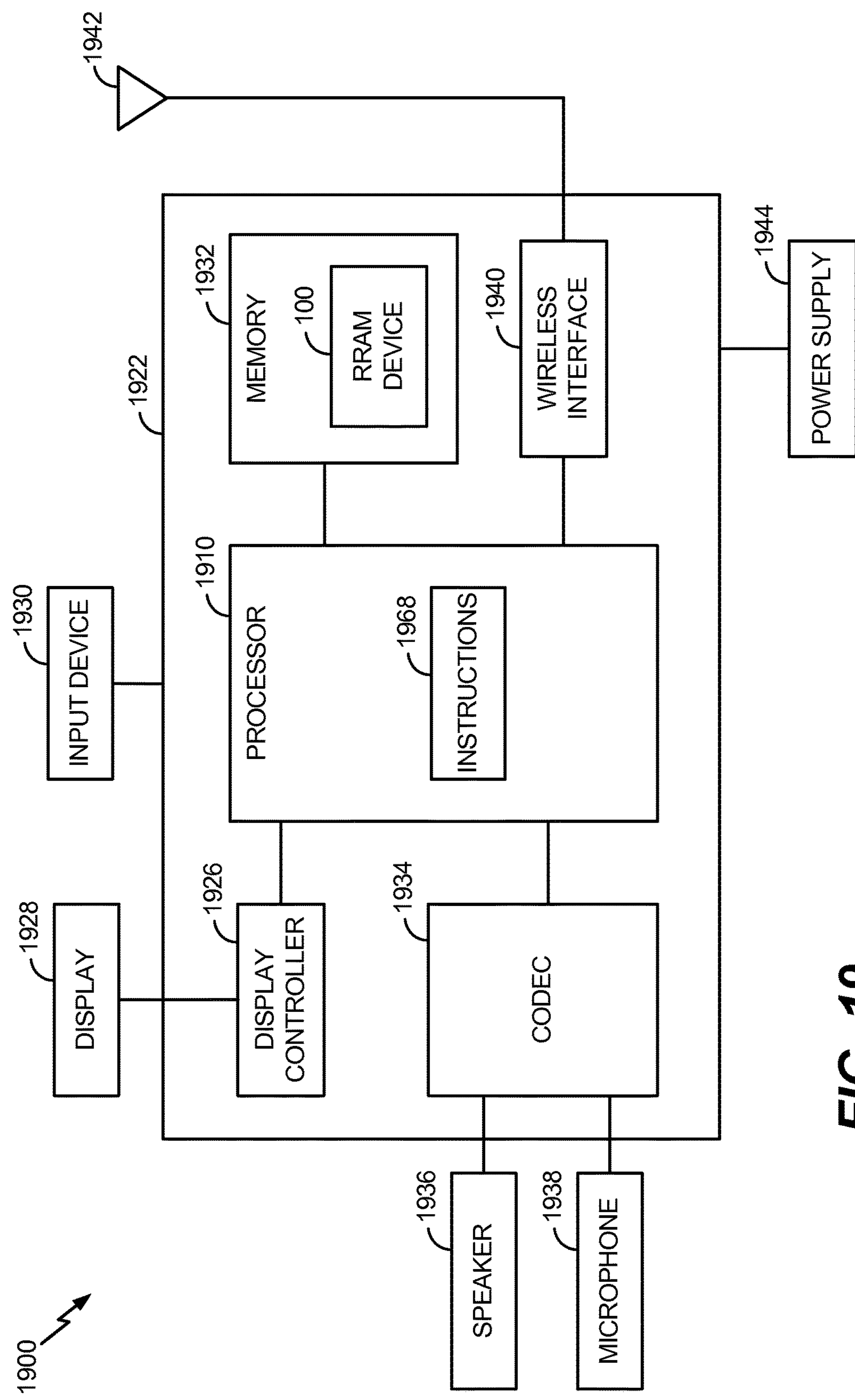
FIG. 19 is a block diagram of an electronic device including a device that includes a SAC to couple a resistance-based storage element in parallel to an access transistor.

Referring to FIG. 19, a block diagram of a particular illustrative embodiment of an electronic device is depicted and generally designated 1900. The electronic device 1900 may correspond to a mobile device (e.g., a cellular telephone), as an illustrative example. In other implementations, the electronic device 1900 may correspond to a computer (e.g., a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 1900 includes a processor 1910, such as a digital signal processor (DSP). The processor 1910 may be configured to execute instructions 1968.

The electronic device 1900 may further include a memory 1932. The memory 1932 is coupled to the processor 1910. The memory 1932 includes the RRAM device 100. For example, the memory 1932 may include an array of resistance-based storage elements each corresponding to the resistance-based storage element 104. In an illustrative implementation, the memory 1932 is fabricated using one or more operations described with reference to the method 1800 of FIG. 18.

FIG. 19 also shows a display controller 1926 that is coupled to the processor 1910 and to a display 1928. A coder/decoder (CODEC) 1934 can also be coupled to the processor 1910. A speaker 1936 and a microphone 1938 can be coupled to the CODEC 1934. FIG. 19 also indicates that a wireless interface 1940, such as a wireless controller and/or a transceiver, can be coupled to the processor 1910 and to an antenna 1942.

In a particular embodiment, the processor 1910, the display controller 1926, the memory 1932, the CODEC 1934, and the wireless interface 1940 are included in a system-in-package or system-on-chip device 1922. Further, an input device 1930 and a power supply 1944 may be coupled to the system-on-chip device 1922. Moreover, in a particular embodiment, as illustrated in FIG. 19, the display 1928, the input device 1930, the speaker 1936, the microphone 1938, the antenna 1942, and the power supply 1944 are external to the system-on-chip device 1922. However, each of the display 1928, the input device 1930, the speaker 1936, the microphone 1938, the antenna 1942, and the power supply 1944 can be coupled to a component of the system-on-chip device 1922, such as to an interface or to a controller.

In an illustrative example, an apparatus includes means (e.g., the resistive material 160) for generating a resistive state indicating a value associated with a resistance-based storage element (e.g., the resistance-based storage element 104). The apparatus further includes means (e.g., the second electrode 162) for providing a current (e.g., the current 1706) to the means for generating. The apparatus further includes means (e.g., the first electrode 158) for receiving the current from the means for generating. A first interface (e.g., the first interface 164) of the means for generating and the means for receiving and a second interface (e.g., the second interface 166) of the means for generating and the means for providing are substantially perpendicular to a surface of a substrate (e.g., the surface 172 of the substrate 170). In an illustrative implementation, the apparatus also includes means (e.g., any of the SACs 154, 156) for coupling the resistance-based storage element in parallel to an access transistor (e.g., the access transistor 108). The means for coupling may have a sidewall that is adjacent to the means for receiving. For example, the first SAC 154 has a sidewall that is adjacent to the first electrode 158.

Figure 20:
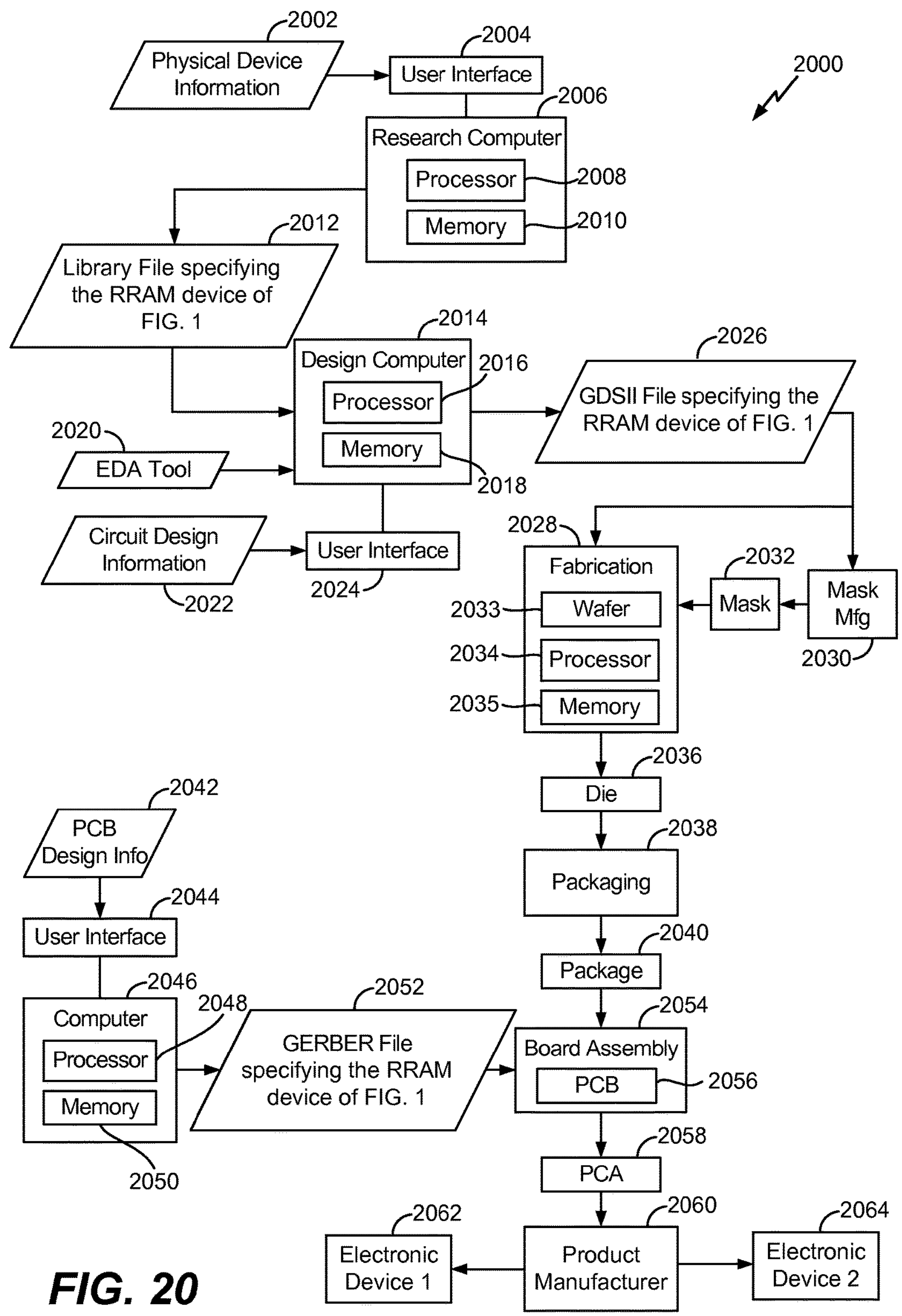
FIG. 20 is a data flow diagram of a particular illustrative embodiment of a manufacturing process to manufacture one or more electronic devices that include a SAC to couple a resistance-based storage element in parallel to an access transistor.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 1900 of FIG. 19. FIG. 20 depicts a particular illustrative embodiment of an electronic device manufacturing process 2000.

Physical device information 2002 is received at the electronic device manufacturing process 2000, such as at a research computer 2006. The physical device information 2002 may include design information representing at least one physical property of the RRAM device 100 of FIG. 1. For example, the physical device information 2002 may include physical parameters, material characteristics, and structure information that is entered via a user interface 2004 coupled to the research computer 2006. The research computer 2006 includes a processor 2008, such as one or more processing cores. The processor 2008 is coupled to a computer-readable medium, such as a memory 2010. The memory 2010 may store computer-readable instructions that are executable by the processor 2008 to transform the physical device information 2002 to comply with a file format and to generate a library file 2012.

The library file 2012 may include at least one data file including the transformed design information. For example, the library file 2012 may specify a library of devices including the RRAM device 100 of FIG. 1.

The library file 2012 may be used in conjunction with an electronic design automation (EDA) tool 2020 at a design computer 2014. The design computer 2014 includes a processor 2016, such as one or more processing cores. The processor 2016 is coupled to a memory 2018. The EDA tool 2020 may include processor executable instructions stored at the memory 2018 to enable a user of the design computer 2014 to design a circuit that includes the RRAM device 100 of FIG. 1. For example, a user of the design computer 2014 may enter circuit design information 2022 via a user interface 2024 coupled to the design computer 2014. The circuit design information 2022 may include design information representing at least one physical property of a device, such as the RRAM device 100 of FIG. 1. To illustrate, the circuit design property may include identification of particular circuits and relationships to other elements in a circuit design, positioning information, feature size information, interconnection information, or other information representing a physical property of a device, such as the RRAM device 100 of FIG. 1.

The design computer 2014 may be configured to transform the circuit design information 2022 to comply with a file format. To illustrate, the file format may include a database binary file format representing planar geometric shapes, text labels, and other information about a circuit layout in a hierarchical format, such as a Graphic Data System (GDSII) file format. The design computer 2014 may be configured to generate a data file including the transformed design information, such as a GDSII file 2026 that includes information describing the RRAM device 100 of FIG. 1.

The GDSII file 2026 may be received at a fabrication process 2028. The fabrication process 2028 may fabricate one or more of the RRAM device 100 of FIG. 1 based on the GDSII file 2026. In a particular embodiment, the fabrication process 2028 includes one or more operations of the method 1800 of FIG. 18.

The GDSII file 2026 may be provided to a mask manufacturer 2030 to create one or more masks, such as masks to be used with photolithography processing, illustrated in FIG. 20 as a representative mask 2032. The mask 2032 may be used during the fabrication process 2028 to generate one or more wafers 2033, which may be tested and separated into dies, such as a representative die 2036. The die 2036 may include the RRAM device 100 of FIG. 1.

Operations of the fabrication process 2028 may be initiated or controlled using a processor 2034 and a memory 2035. The memory 2035 may store instructions that are executable by the processor 2034.

The fabrication process 2028 may be implemented by a fabrication system that is fully automated or partially automated. For example, the fabrication process 2028 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, form a gate stack (e.g., using a metal gate process), perform a shallow trench isolation (STI) process, and/or perform a standard clean 1 process, as illustrative examples.

The fabrication system may have a distributed architecture (e.g., a hierarchy). For example, the fabrication system may include one or more processors, such as the processor 2034, one or more memories, such as the memory 2035, and/or one or more controllers that are distributed according to the distributed architecture. The distributed architecture may include a high-level processor that controls or initiates operations of one or more low-level systems. For example, a high-level portion of the fabrication process 2028 may be initiated or controlled by one or more processors, such as the processor 2034, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment, such as one or more processing tools. Example processing tools include doping or deposition tools (e.g., a molecular beam epitaxial growth tool, a flowable chemical vapor deposition (FCVD) tool, a conformal deposition tool, or a spin-on deposition tool) and removal tools (e.g., a chemical removal tool, a reactive gas removal tool, a hydrogen reaction removal tool, or a standard clean 1 removal tool).

In a particular embodiment, the fabrication system may include multiple processors that are distributed in the fabrication system. For example, a controller of a low-level system component may include a processor, such as the processor 2034. Alternatively, the processor 2034 may be a part of a high-level system, subsystem, or component of the fabrication system. In another embodiment, the processor 2034 includes distributed processing at various levels and components of a fabrication system.

In connection with the described embodiments, a computer-readable medium (e.g., the memory 2035) stores instructions that are executable by a processor (e.g., the processor 2034) to perform operations during fabrication of a device. The device may correspond to the RRAM device 100 of FIG. 1. The operations may correspond to operations of the method 1800 of FIG. 18. The operations may include initiating formation of a first electrode (e.g., the first electrode 158) and a second electrode (e.g., the second electrode 162). The operations may also include, after forming the first electrode and the second electrode, initiating formation of a resistive material (e.g., the resistive material 160) between the first electrode and the second electrode to form a resistance-based storage element (e.g., the resistance-based storage element 104) of an RRAM device (e.g., the RRAM device 100).

The die 2036 may be provided to a packaging process 2038. The packaging process 2038 may incorporate the die 2036 into a representative package 2040. The package 2040 may include a single die (such as the die 2036) or multiple dies, such as in connection with a system-in-package (SiP) arrangement. The package 2040 may be configured to conform to one or more standards or specifications, such as one or more Joint Electron Device Engineering Council (JEDEC) standards.

Information regarding the package 2040 may be distributed to various product designers, such as using a component library stored at a computer 2046. The computer 2046 may include a processor 2048, such as one or more processing cores, coupled to a memory 2050. A printed circuit board (PCB) tool may be stored as processor executable instructions at the memory 2050 to process PCB design information 2042 received from a user of the computer 2046 via a user interface 2044. The PCB design information 2042 may include physical positioning information of a packaged device on a circuit board. The packaged device may include the RRAM device 100 of FIG. 1.

The computer 2046 may be configured to transform the PCB design information 2042 to generate a data file, such as a GERBER file 2052. The GERBER file 2052 may indicate physical positioning information of a packaged device on a circuit board, as well as layout of electrical connections, such as traces and vias. The packaged device may include the RRAM device 100 of FIG. 1. In other embodiments, the data file generated by transforming PCB design information 2042 may have a format other than a GERBER format.

The GERBER file 2052 may be received at a board assembly process 2054 and used to create PCBs, such as a representative PCB 2056. The PCB 2056 may be manufactured in accordance with the design information indicated by the GERBER file 2052. For example, the GERBER file 2052 may be uploaded to one or more machines to perform one or more operations of a PCB production process. The PCB 2056 may be populated with electronic components including the package 2040 to form a representative printed circuit assembly (PCA) 2058.

The PCA 2058 may be received at a product manufacture process 2060 and integrated into one or more electronic devices, such as a first representative electronic device 2062 and a second representative electronic device 2064. For example, the first representative electronic device 2062 and/or the second representative electronic device 2064 may include or correspond to the electronic device 1900 of FIG. 19. The first representative electronic device 2062 and/or the second representative electronic device 2064 may include a mobile device (e.g., a cellular telephone), a computer (e.g., a laptop computer, a tablet computer, a notebook computer, or a desktop computer), a set top box, an entertainment unit, a navigation device, a personal digital assistant (PDA), a monitor (e.g., a television monitor or a computer monitor), a television, a tuner, a radio (e.g., a satellite radio), a music player (e.g., a digital music player and/or a portable music player), a video player (e.g., a digital video player, such as a digital video disc (DVD) player and/or a portable digital video player), another electronic device, or a combination thereof.

One or more aspects of the embodiments described with respect to FIGS. 1-20 may be represented by the library file 2012, the GDSII file 2026, and/or the GERBER file 2052. One or more aspects of the embodiments described with respect to FIGS. 1-20 may be represented by information stored at the memory 2010 of the research computer 2006, the memory 2018 of the design computer 2014, the memory 2050 of the computer 2046, and/or a memory of one or more other computers or processors (not shown) used at the various stages, such as at the board assembly process 2054. One or more aspects of the embodiments described with respect to FIGS. 1-20 may be can also be incorporated into one or more other physical embodiments, such as the mask 2032, the die 2036, the package 2040, the PCA 2058, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 2000 may be performed by a single entity or by one or more entities performing various stages of the electronic device manufacturing process 2000.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:

a first electrode of a resistance-based storage element;

a second electrode of the resistance-based storage element;

a resistive material of the resistance-based storage element, wherein a first interface of the resistive material and the first electrode and a second interface of the resistive material and the second electrode are substantially perpendicular to a surface of a substrate; and a dielectric region, wherein a first surface of the first electrode and a first surface of the second electrode are in contact with the same surface of the dielectric region, wherein a second surface of the first electrode is in contact with a first contact, and wherein a second surface of the second electrode is in contact with a second contact.

2. The apparatus of claim 1, further comprising a plurality of resistance-based storage elements including the resistance-based storage element and further including a second resistance-based storage element coupled to the resistance-based storage element in series.

3. The apparatus of claim 1, wherein the second electrode is configured to provide a current to the first electrode through the resistive material, the current oriented substantially parallel to the surface of the substrate, and wherein the resistance-based storage element has an in-plane configuration relative to the surface of the substrate.

4. The apparatus of claim 1, further comprising an access transistor associated with the resistance-based storage element, wherein the dielectric region is in contact with a gate structure of the access transistor.

5. The apparatus of claim 4, wherein the first contact comprises a first self-aligned contact (SAC) coupled to the second surface of the first electrode and to a first terminal of the access transistor, and wherein the second contact comprises a second SAC coupled to the second surface of the second electrode and to a second terminal of the access transistor.

6. The apparatus of claim 5, wherein the first SAC and the second SAC couple the resistance-based storage element in parallel with the access transistor.

7. An apparatus comprising:

means for generating a resistive state indicating a value associated with a resistance-based storage element;

means for providing a current to the means for generating;

means for receiving the current from the means for generating, wherein a first interface of the means for generating and the means for receiving and a second interface of the means for generating and the means for providing are substantially perpendicular to a surface of a substrate; and means for insulating positioned between the substrate and each of the means for generating, the means for providing, and the means for receiving, wherein a first surface of the means for providing and a first surface of the means for receiving are in contact with the same surface of the means for insulating, wherein a second surface of the means for providing is in contact with a first surface of means for coupling the resistance-based storage element to an access transistor, and wherein a second surface of the means for receiving is in contact with a second surface of the means for coupling.

8. The apparatus of claim 7, wherein the means for generating includes a resistive material, wherein the means for receiving includes a first electrode, wherein the means for insulating includes a dielectric material, and wherein the means for providing includes a second electrode, and wherein the means for coupling includes a first self-aligned contact (SAC) and a second SAC.

9. The apparatus of claim 7, further comprising the means for coupling the resistance-based storage element in parallel to the access transistor, the means for coupling having a sidewall that is adjacent to the means for receiving.

10. The apparatus of claim 9, wherein the means for coupling includes a first self-aligned contact (SAC) and a second SAC.

11. The apparatus of claim 10, wherein a first interface of the first SAC and the means for receiving and a second interface between the second SAC and the means for generating are substantially perpendicular to a surface of a substrate.

12. The apparatus of claim 7, wherein the means for receiving, the means for generating, and the means for providing are in contact with the same surface of the means for insulating.

13. The apparatus of claim 1, wherein the resistance-based storage element is included in a mobile communication device.

14. The apparatus of claim 1, further comprising an access transistor including a gate structure, wherein the dielectric region is positioned between the resistive material and the gate structure.

15. The apparatus of claim 14, wherein the first electrode, the second electrode, and the resistive material are in contact with the same surface of the dielectric region.

16. The apparatus of claim 4, wherein the first electrode and the second electrode are in contact with the same surface of the dielectric region, wherein the first surface and the second surface of the first electrode are adjacent surfaces.

17. The apparatus of claim 6, wherein a first sidewall of the first SAC is adjacent to the first electrode, and wherein a second sidewall of the second SAC is adjacent to the second electrode.

18. The apparatus of claim 2, further comprising a plurality of serially coupled access transistors including a first access transistor and a second access transistor, the first access transistor coupled in parallel with the resistance-based storage element, the second access transistor coupled in parallel with the second resistance-based storage element.

19. The apparatus of claim 18, further comprising a first select transistor coupled to the plurality of serially coupled access transistors.

20. The apparatus of claim 19, further comprising a ground select line coupled to a first gate terminal of the first select transistor.

21. The apparatus of claim 20, further comprising:

a second select transistor coupled to the plurality of serially coupled access transistors;

a bit line select line coupled to a second gate terminal of the second select transistor; and a bit line coupled to a source-or-drain (S/D) terminal of the second select transistor.

* * * * *